(12) United States Patent
Omura

(10) Patent No.: US 6,191,027 B1
(45) Date of Patent: Feb. 20, 2001

(54) METHOD OF FORMING FLAT WIRING LAYER

(75) Inventor: Masayoshi Omura, Hamamatsu (JP)

(73) Assignee: Yamaha Corporation (JP)

( * ) Notice: Under 35 U.S.C. 154(b), the term of this patent shall be extended for 0 days.

(21) Appl. No.: 09/389,314

(22) Filed: Sep. 2, 1999

Related U.S. Application Data

(63) Continuation of application No. 09/075,688, filed on May 11, 1998, now Pat. No. 6,028,362.

(30) Foreign Application Priority Data

May 12, 1997 (JP) .................................. 9-137931

(51) Int. Cl.[7] ............................................. H01L 21/4763
(52) U.S. Cl. ...................... 438/627; 438/633; 438/637; 438/638; 438/639; 438/596
(58) Field of Search ..................... 438/627, 637, 438/633, 638, 639, 644, 645, 646, 632, 624, 596, 622, 618

(56) References Cited

U.S. PATENT DOCUMENTS

| | | | |
|---|---|---|---|
| 5,173,442 | 12/1992 | Carey ................................. | 438/620 |
| 5,262,354 | 11/1993 | Cote et al. ........................ | 257/763 |
| 5,427,981 | 6/1995 | Choi .................................. | 438/630 |
| 5,529,953 | 6/1996 | Shoda ............................... | 438/644 |
| 5,534,461 | 7/1996 | Kuwajima ......................... | 438/465 |
| 5,637,924 | 6/1997 | Hibino .............................. | 257/751 |
| 5,686,354 | 11/1997 | Avanzino et al. ................. | 438/625 |
| 5,689,140 | 11/1997 | Shoda ............................... | 257/774 |
| 5,693,563 | 12/1997 | Teong ................................ | 438/627 |
| 5,705,849 | 1/1998 | Zheng et al. ..................... | 257/530 |

OTHER PUBLICATIONS

K. Ueno, et al., "A Quarter–Micron Planarized Interconnection Technology with Self–Aligned Plug", IEDM 1992, pp. 305–308.

T. Zettler, et al., "Self–Reconstructing Metallization—A Novel Planar Process for VLSI Metallization", VMIC Conference, Jun. 8–9, 1993, pp. 359–365.

A. Krishnan, et al., "Copper Metallization for VLSI Applications", VMIC Conference, Jun. 9–10, 1992, pp. 226–231.

K. Suguro et al., "Cu Inlaid Interconnections Formed by Dual Damascene", ULSI Research Laboratories, Manufacturing Engineering Research Center, Semiconductor Division, Toshiba Corporation, pp. 42–47.

K. Kikuta, et al., "Aluminum–Germanium–Copper Multilevel Damascene Process Using Low Temperature Reflow Sputtering and Chemical Mechanical Polishing", IEDM 1994, pp. 101–104.

*Primary Examiner*—Charles Bowers
*Assistant Examiner*—Hsien Ming Lee
(74) *Attorney, Agent, or Firm*—Ostrolenk, Faber, Gerb & Soffen, LLP

(57) ABSTRACT

A method of fabricating a semiconductor device include the steps of: providing a substrate having an insulating layer thereon; forming a connection hole including a first sub-hole and a second sub-hole mutually connected in the insulating layer, wherein the first sub-hole has a first diameter and the second sub-hole has a second diameter larger than the first diameter; forming a first conductive layer over the substrate; removing the first conductive to a thickness so as to form a side wall spacer film on a side wall of the second sub-hole and a plug film in the first sub-hole; forming a barrier metal layer over the substrate to cover the side wall spacer and the plug film; forming a second conductive layer over the substrate to fill space in the connection hole; and chemical mechanical polishing the second conductive layer.

9 Claims, 18 Drawing Sheets

METHOD OF FORMING FLAT WIRING LAYER

This is a continuation of application Ser. No. 09/075,688, filed May 11, 1998 now U.S. Pat. No. 6,028,362.

This application is based on Japanese Patent Application No. 9-137931 filed on May 12, 1997, the entire contents of which are incorporated herein by reference.

BACKGROUND OF THE INVENTION a) Field of the Invention

The present invention relates to a method of forming a flat wiring layer with a damascene method, and more particularly to a flat wiring layer forming method capable of forming a low resistance and high reliability flat wiring layer by depositing a conductive layer inlaid in connection holes and interconnect grooves formed in an insulating film and thereafter planarizing the conductive layer.

b) Description of the Related Art

A flat wiring layer forming method with a damascene method is already known, for example, as illustrated in FIGS. 28 to 30 (e.g., refer to "DUAL DAMASCENE: A ULSI WIRING TECHNOLOGY", Carter W. Kaanta et al. Jun. 11–12, 1991 VMIC Conference).

At the process shown in FIG. 28, after wirings 2A and 2B are embedded in a surface layer of an insulating film 1, the surface of the insulating film 1 is planarized by CMP (chemical mechanical polishing). Another insulating film 3 is formed on the planarized surface of the insulating film 1.

A resist pattern 4 having holes 4a and 4b corresponding to connection portions to the wirings 2A and 2B is formed on the insulating film 3. Another resist pattern 5 is formed on the resist pattern 4, the resist pattern 5 having an interconnect hole coupling the holes 4a and 4b of the resist pattern 4.

In the process shown in FIG. 29, by using the resist patterns 4 and 5 as a mask, the insulating film 3 is dry-etched to form connection holes 3a and 3b reaching the wirings 2A and 2B and an interconnect groove 3A coupling the connection holes 3a and 3b, respectively in the insulating film 3. The connection holes 3a and 3b correspond to the holes 4a and 4b of the resist pattern 4, and the interconnect groove 3A corresponds to the hole 5A of the resist pattern 5.

In the process shown in FIG. 30, a W (tungsten) layer 6 is deposited on the insulating film 3 by CVD (chemical vapor deposition), the W layer 6 filling the connection holes 3a and 3b and interconnect groove 3A. The W layer 6 is planarized by CMP to leave a portion of the W layer 6 in the connection holes 3a and 3b and interconnect groove 3A.

With this conventional technique, the material of the wiring 6A is tungsten having a high resistivity so that a wiring resistance becomes high.

SUMMARY OF THE INVENTION

It is an object of the present invention to provide a novel flat wiring layer forming method capable of forming a flat wiring layer having low resistance and high reliability.

According to one aspect of the present invention, there is provided a method of fabricating a semiconductor device, comprising the steps of: a) providing a substrate having an insulating layer thereon; b) forming a connection hole including a first sub-hole and a second sub-hole mutually aligned and connected in the insulating layer, wherein the first sub-hole has a first diameter and the second sub-hole has a second diameter larger than the first diameter; c) forming a first conductive layer over the substrate; d) removing the first conductive layer to a thickness so as to form a side wall spacer film on a side wall of the second sub-hole and a plug film in the first sub-hole; e) forming a barrier metal layer over the substrate to cover the side wall spacer and the plug film; f) forming a second conductive layer over the substrate to fill space in the connection hole; and g) chemical mechanical polishing the second conductive layer.

If the second conductive layer is made of wiring material having a low resistivity, the resistance of a wiring layer can be lowered.

When the first conductive layer is etched, the side wall spacer film is left on the side wall of the second sub-hole and the plug in the first sub-hole. It is therefore possible to improve the step coverage of the barrier metal layer.

According to a second aspect of the present invention, there is provided a method of fabricating a semiconductor device, comprising the steps of: a) providing a substrate having an insulating layer thereon; b) forming a connection hole including a first sub-hole and a second sub-hole mutually aligned and connected in the insulating layer, wherein the first sub-hole has a first diameter and the second sub-hole has a second diameter larger than the first diameter; c) forming a first conductive layer over the substrate; d) removing the first conductive layer to a thickness so as to form a side wall spacer film on a side wall of the second sub-hole and a plug film in the first sub-hole from the first conductive layer, respectively, wherein the plug film has a seam therein; e) forming a barrier metal layer over the substrate to cover the side wall spacer and the plug film; f) forming a second conductive layer over the substrate to fill space in the connection hole; and g) planarizing the second conductive layer to provide a damascene structure in the connection hole.

If the second conductive layer is made of wiring material having a low resistivity, the resistance of a wiring layer can be lowered.

When the first conductive layer is etched, the side wall spacer film is left on the side wall of the second sub-hole and the plug in the first sub-hole. It is therefore possible to improve the step coverage of the barrier metal layer. A void or seam in the plug made of the first conductive layer can be reliably covered with the barrier layer so that the reliability of the wiring layer can be improved.

BRIEF DESCRIPTION OF THE DRAWINGS

FIGS. 1 to 11 are cross sectional views of a substrate illustrating in sequential order the processes of forming a flat wiring layer according to a first embodiment of the invention, wherein:

FIG. 1 illustrates a transistor forming process;

FIG. 2 illustrates an insulating film forming process;

FIG. 3 illustrates a CMP process;

FIG. 4 illustrates a resist layer forming process;

FIG. 5 illustrates a dry-etching process;

FIG. 6 illustrates a resist layer forming process;

FIG. 7 illustrates a dry-etching process;

FIG. 8 illustrates a process of forming an adhesion layer and a conductive layer;

FIG. 9 illustrates an etch-back process;

FIG. 10 illustrates a process of forming a barrier layer and a wiring material layer; and FIG. 11 illustrates a CMP process.

FIGS. 12 to 16 are cross sectional views of a substrate illustrating in sequential order the processes of forming a flat wiring layer according to a second embodiment of the invention, wherein:

FIG. 12 illustrates an etch-back process;

FIG. 13 illustrates a process of forming a barrier layer and a wiring material layer;

FIG. 14 illustrates a CMP process;

FIG. 15 illustrates a cap layer forming process; and

FIG. 16 illustrates a CMP process.

FIGS. 17 to 23 are cross sectional views of a substrate illustrating in sequential order the processes of forming a flat wiring layer according to a third embodiment of the invention, wherein:

FIG. 17 illustrates a resist layer forming process;

FIG. 18 illustrates another resist layer forming process;

FIG. 19 illustrates a dry-etching process;

FIG. 20 illustrates a process of forming a barrier layer and a wiring material layer;

FIG. 21 illustrates an etch-back process;

FIG. 22 illustrates a wiring material layer forming process; and

FIGS. 25 to 41 are cross sectional views of a substrate illustrating in sequential order the processes of forming a flat wiring layer according to a fourth embodiment of the invention, wherein:

FIG. 25 illustrates a CMP process;

FIG. 26 illustrates a cap layer forming process:

FIG. 27 illustrates a CMP process;

FIG. 28 illustrates a resist layer forming process which is used in a conventional flat wiring layer forming method;

FIG. 29 illustrates a dry-etching process following the process of FIG. 28;

FIG. 30 illustrates a W layer forming process and a CMP process following the process of FIG. 29;

FIG. 31 illustrates an insulating film forming process included in the wiring layer forming method studied by the present inventor;

FIG. 32 illustrates a CMP process:

FIG. 33 illustrates a resist film forming process;

FIG. 34 illustrates a dry-etching process;

FIG. 35 illustrates a process of forming an adhesion layer and a W layer;

FIG. 36 illustrates a CMP process;

FIG. 37 illustrates an insulating film forming process;

FIG. 38 illustrates a resist film forming process;

FIG. 39 illustrates a dry-etching process;

FIG. 40 illustrates a process of forming a barrier layer and a wiring material layer; and FIG. 41 illustrates a CMP process.

DETAILED DESCRIPTION OF THE PREFERRED EMBODIMENTS

Using conductive material having a low resistivity is expected to be effective in reducing the resistance of a damascene wiring layer. However, there is some tradeoff between using material having a low resistivity and using material suitable for forming a conductive plug in a connection hole formed in an insulating film. In this connection, the inventor proposes to use different materials for a plug filled in a connection hole formed in an insulating film and for a damascene wiring layer laterally extending between plugs.

The inventor has studied a wiring layer forming method combined with connection hole embedding techniques and damascene methods, as illustrated in FIGS. 31 to 41.

Figure 31:
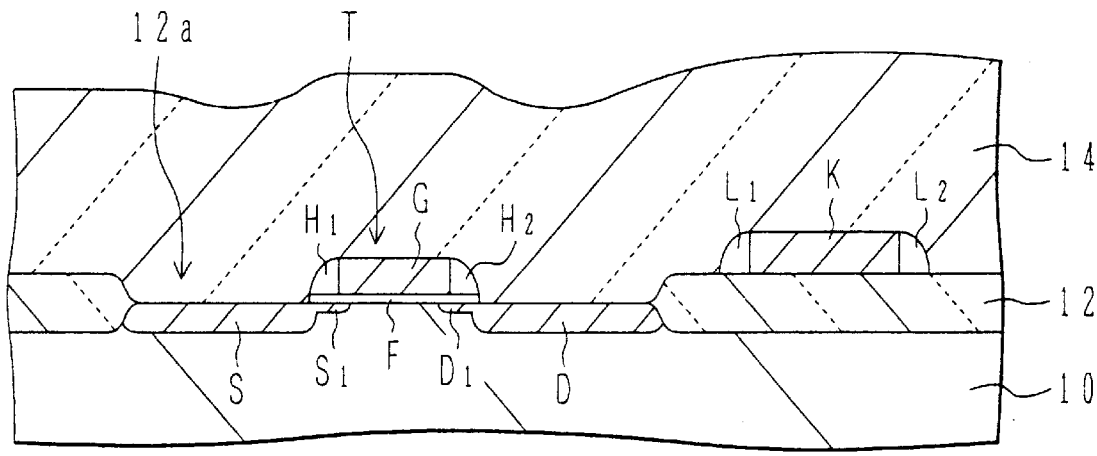

In the process shown in FIG. 31, after a field oxide film 12 having an element hole 12$a$ is formed on the surface of a semiconductor substrate 10 by known local oxidation of silicon (LOCOS), a MOS transistor T is formed in the surface area in the element hole by known methods. For example, the transistor T has a gate insulating film F, a gate electrode G, side spacers $H_1$ and $H_2$, source and drain regions $S_1$ and $D_1$ having a relatively low impurity concentration, and source and drain regions S and D having a relatively high impurity concentration.

By using the same processes of forming the gate electrode G, a wiring K is formed on the insulating film 12, and by using the same processes of forming the side spacers $H_1$ and $H_2$, side spacers $L_1$ and $L_2$ are formed on the side walls of the wiring K. An insulating film 14 made of silicon oxide or the like is deposited on the substrate by CVD, covering the insulating film 12, transistor T, and wiring K.

Figure 32:
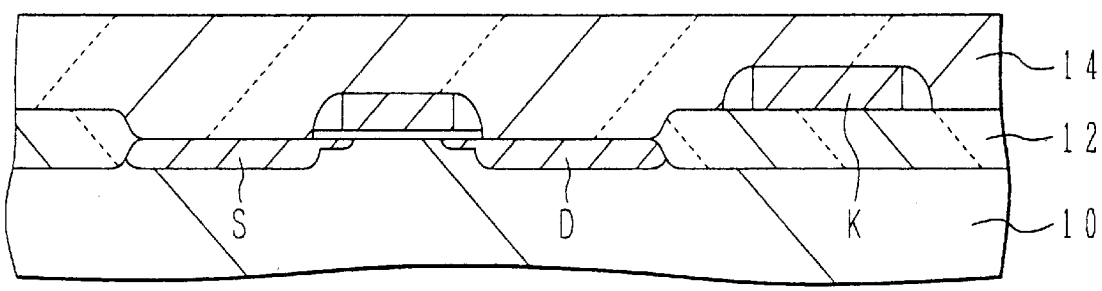
Figure 33:
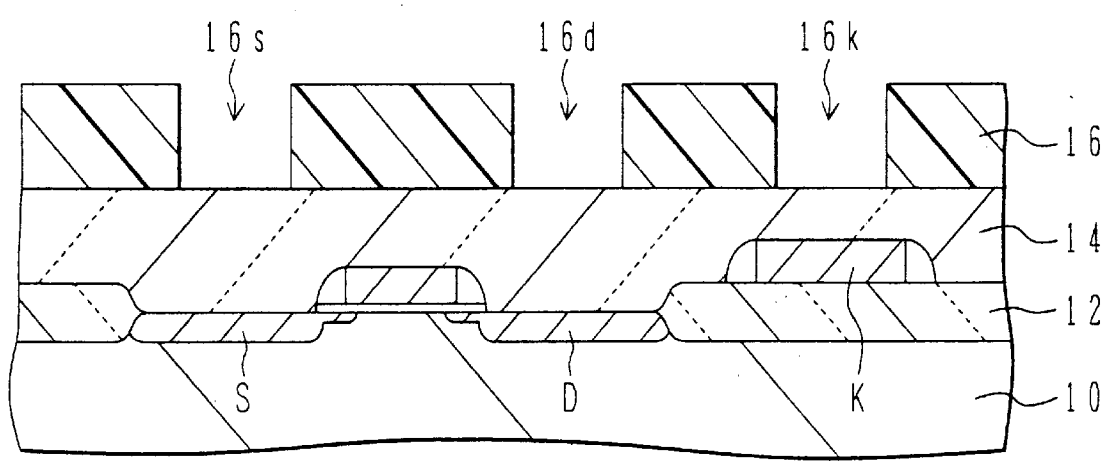

In the process shown in FIG. 32, the insulating film 14 is abraded or lapped by CMP to planarize the surface thereof. In the process shown in FIG. 33, a resist pattern 16 is formed by known photolithography, the resist pattern 16 having holes 16$s$, 16$d$ and 16$k$ corresponding to the connection areas of the source region S, drain region D and wiring K.

Figure 34:
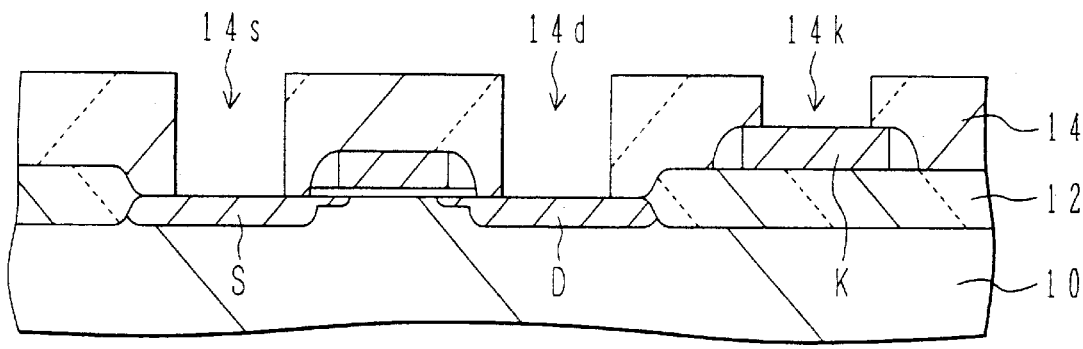

In the process shown in FIG. 34, by using the resist pattern 16 as a mask, the insulating film 14 is anisotropically etched to form connection holes 14$s$, 14$d$ and 14$k$ which reach the source region S, drain region D and wiring K, respectively. Thereafter, the resist pattern 16 is removed.

Figure 35:
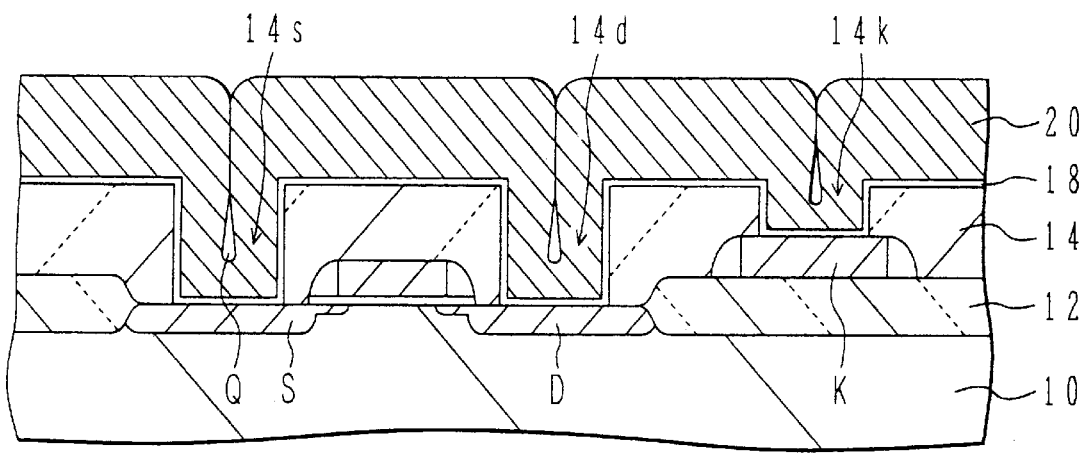

In the process shown in FIG. 35, an adhesion layer 18 such as TiN/Ti (Ti is a lower layer) is sputtered on the inner surfaces of the connection holes 14$s$, 14$d$ and 14$k$ and on the surface of the insulating film 14, in order to ensure good adhesion to a W layer. A W layer 20 is formed by CVD on the adhesion layer 18, filling the insides of the connection holes 14$s$, 14$d$ and 14$k$.

Figure 36:
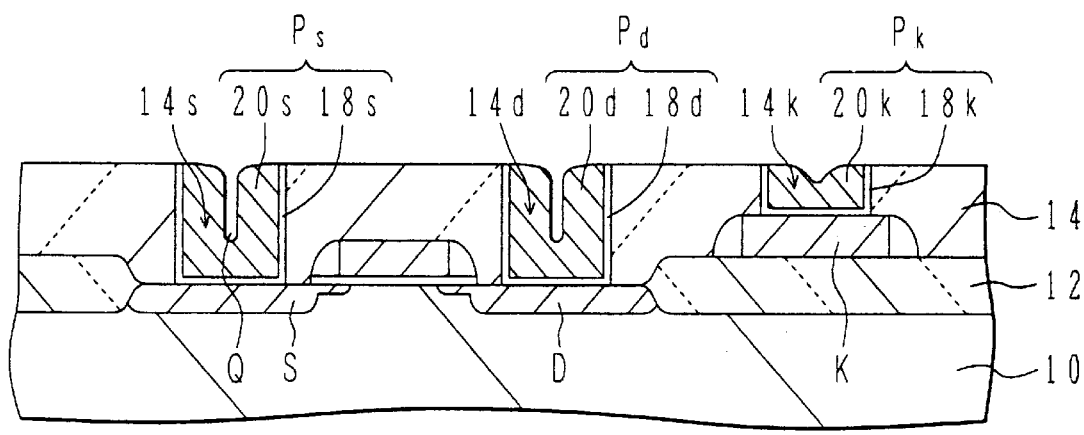

In the process shown in FIG. 36, a lamination of the adhesion layer 18 and W layer 20 is partially removed and planarized to leave first, second and third portions 18$s$, 18$d$ and 18$k$ of the adhesion layer 18 and first, second and third portions 20$s$, 20$d$ and 20$k$ of the W layer 20, respectively in the connection holes 14$s$, 14$d$ and 14$k$. The portions 18$s$ and 20$s$ form a plug Ps, the portions 18$d$ and 20$d$ form a plug Pd, and the portions 18$k$ and 20$k$ form a plug Pk. The space (void or seam) formed in the W layer 20 expands by this CMP process.

Figure 37:
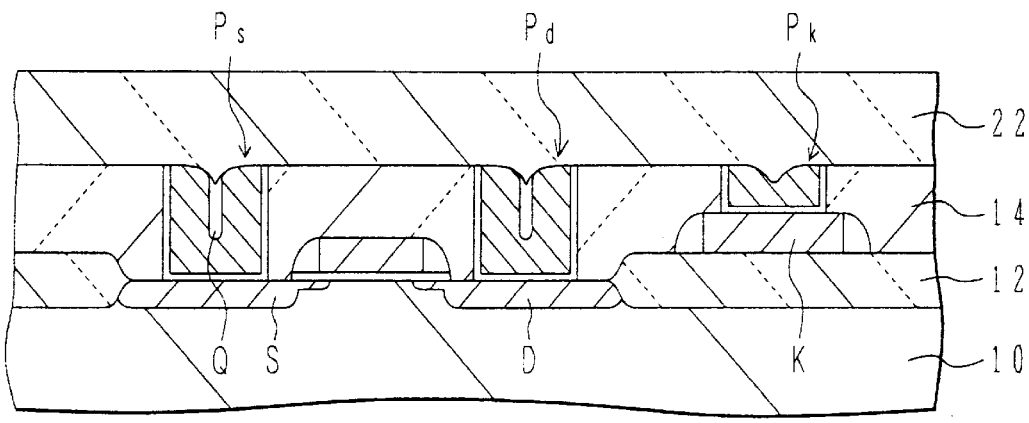

In the process shown in FIG. 37, an insulating film 22 such as Si oxide is formed by CVD on the substrate, covering the insulating film 14 and plugs Ps, Pd and Pk.

Figure 38:
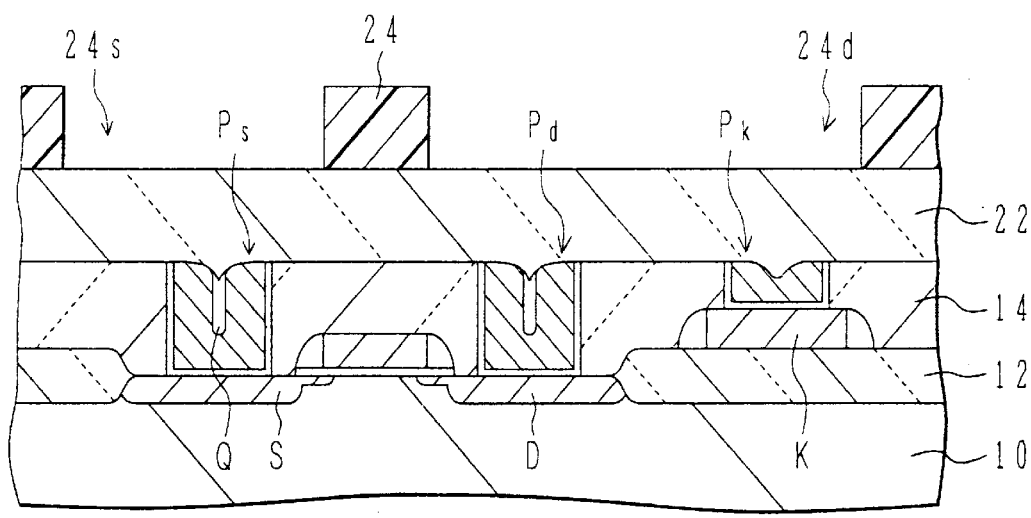

In the process shown in FIG. 38, a resist pattern 24 is formed by photolithograpy, the resist pattern 24 having a hole 24$s$ corresponding to an interconnect groove for the plug Ps and a hole 24$d$ corresponding to an interconnect groove for the plugs Pd and Pk. The interconnect groove is used for inlaying a damascene interconnect and has a shape conformal to the shape of an interconnect which interconnects two or more connection holes and to the shape of an interconnect which extends the wiring in the connection hole to another contact position.

Figure 39:
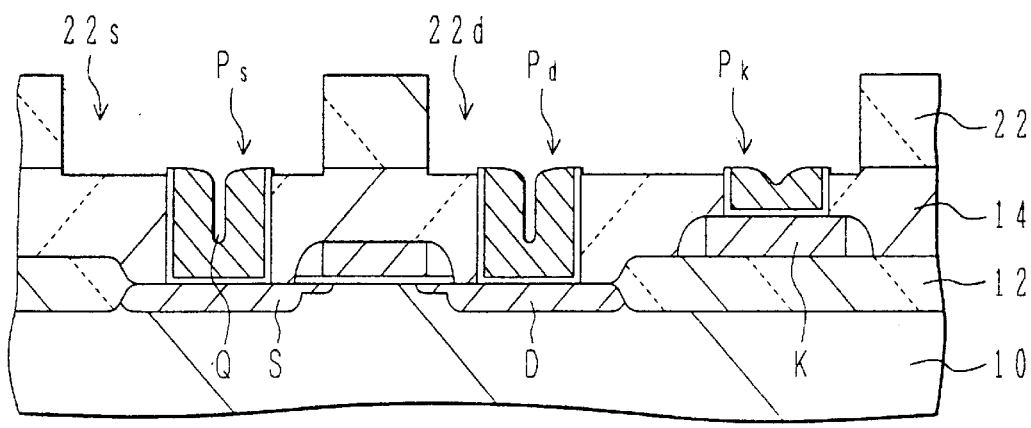

In the process shown in FIG. 39, by using the resist pattern 24 as a mask, the insulating film 22 is anisotropically etched to form interconnect grooves 22s and 22d in the insulating film 22. The interconnect groove 22s is used for the interconnect to the plug Ps, and the interconnect groove 22d is used for the local interconnect between the plugs Pd and Pk. Thereafter, the resist pattern 24 is removed.

Figure 40:
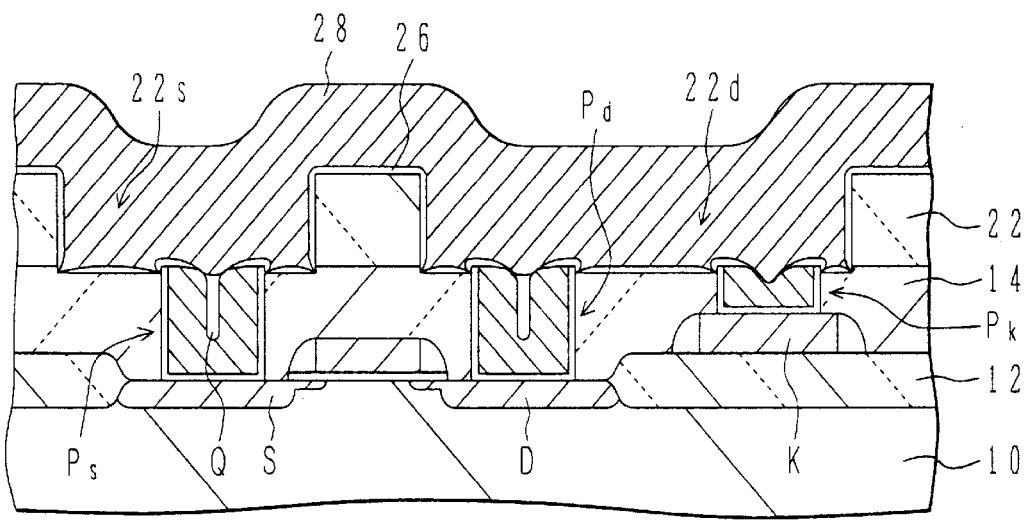

In the process shown in FIG. 40, a barrier layer 26 such as TiN/Ti (Ti is a lower layer) is formed through sputtering on the inner surfaces of the interconnect grooves 22s and 22d and on the insulating film 22. A wiring layer 28 such as Al alloy is sputtered on the barrier layer 26, being inlaid in the interconnect grooves 22s and 22d. The barrier layer 26 is used in order to prevent Al or the like in the wiring layer 28 from diffusing into the W plugs and Si substrate.

Figure 41:
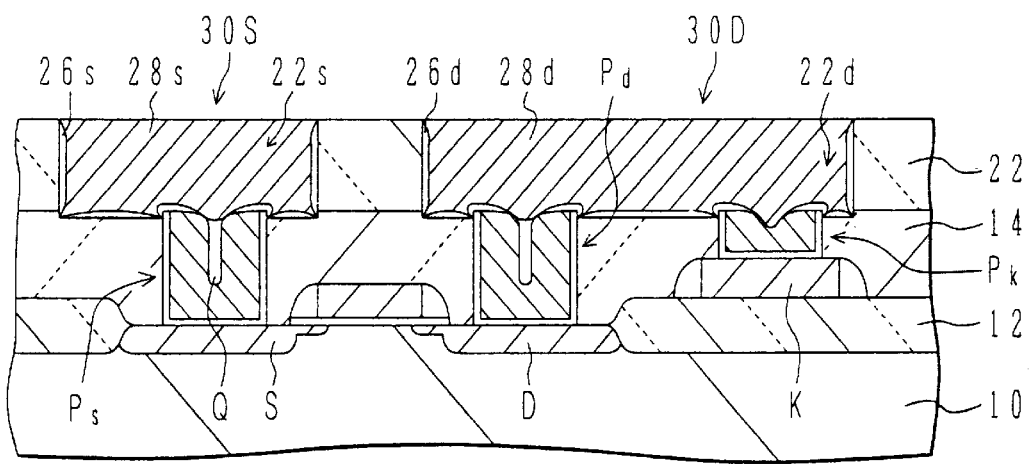

In the process shown in FIG. 41, a lamination of the barrier layer 26 and wiring layer 28 is partially removed from the upper surface thereof and planarized, to leave a first portion 26s of the layer 26 and a first portion 28s of the layer 28 in the interconnect groove 22s and to leave a second portion 26d of the layer 26 and a second portion 28d of the layer 28 in the interconnect groove 22d. The plug Ps and portions 26s and 28s form an interconnect 30S connected to the source region S. The plug Pd, portions 26d and 28d and plug Pk form an interconnect 30D locally interconnecting the drain region D and wiring K.

With the wiring layer forming method described with reference to FIGS. 31 to 41, the interconnects 30S and 30D excepting the plugs are made of wiring material such as Al alloy. It is therefore easy to reduce the total wiring resistance. However, it has been found that there is a problem of degraded reliability of interconnects, as will be described hereinunder.

In the W layer deposition process shown in FIG. 35, as the process of depositing W on the inner surfaces of the connection holes 14s, 14d and 14k proceeds, a supply of source gas (WF$_6$) to the insides of the connection holes is limited more so that the W deposition speed in the inside of the connection holes lowers more than the outside thereof. When the upper wall of the W layer 20 covering the inside of each connection hole is closed, the source gas cannot be supplied to the inside of the connection hole and the W deposition stops. A space (seam or void) Q is therefore formed inside each connection hole.

In the CMP process shown in FIG. 36, abrasive particles of alumina (Al$_2$O$_3$) added with oxidant H$_2$O$_2$ is used as an abrading agent. More specifically, the abrading mechanism is the oxidizing of the surface of the W layer 20 by the oxidant to form a fragile oxide which is removed by mechanical abrasion with alumina abrasive particles. As the abrading proceeds, the oxidant enters the seam or void Q and the upper opening of the space Q is enlarged as shown in FIG. 36. Since alumina abrasive particles also enter the seam or void Q, it is very difficult in practice to remove the alumina abrasive particles in the seam or void Q through brushing or chemical washing after the CMP process.

Even if the upper opening of the seam or void Q is enlarged, the inner diameter of the seam or void Q is very small so that it is hard to completely fill the inside of the seam or void Q during the insulating film deposition process shown in FIG. 37 or during the process of depositing the barrier layer and wiring material layer shown in FIG. 40. The seam or void Q is therefore left even after the interconnects 30S and 30D are formed, as shown in FIG. 41. If the wiring metal is exposed to such a seam or void Q, the void may be grown or scattered in the wiring metal because of electromigration or the like and the reliability of interconnects is lowered.

In the process of etching the insulating film shown in FIG. 39, it is desired to stop etching when the plugs Ps, Pd and Pk are exposed at the bottoms of the interconnect grooves 22s and 22d. However, it is not easy to detect the end point of the etching. Moreover, since the etching rate is not uniform over the whole surface of a wafer, over-etch of about 50 to 100 nm is performed to ensure that all the plugs are exposed. As a result, the insulating film 14 is etched deeper than the peak level of the plugs Ps, Pd and Pk, and the plugs are protruded higher than the bottoms of the interconnect grooves.

If the barrier layer 26 is formed at the process shown in FIG. 40 after the process shown in FIG. 39 by which the upper wall of the seam or void Q is enlarged and the plugs Ps, Pd and Pk are protruded higher than the bottoms of the interconnect grooves, then the coverage of the barrier layer 26 is degraded at the opening of the seam or void Q and near at the plugs. Furthermore, since the bottom of each of the interconnect grooves 22s and 22d is generally vertical to the side wall thereof as shown in FIG. 39, the coverage of the barrier layer 26 at the process shown in FIG. 40 is also degraded at these right angle corners.

If the coverage of the barrier layer 26 is degraded at the opening of the seam or void Q, this seam or void Q is exposed to the wiring metal of Al alloy or the like so that the reliability of interconnects is lowered from the same reason described previously. The lowered coverage of the barrier layer 26 degrades the barrier performance and hence the reliability of interconnects. For example, if Cu is used as the wiring metal, Cu may be diffused into the insulating films 14 and 22 from the regions where the barrier performance of the barrier layer 26 is lowered, or oxygen in the insulating films 14 and 22 may oxidize Cu. The reliability of interconnects is therefore degraded.

In order to alleviate the problems accompanied by the CMP process, such as fine abrasive particles left in the seam or void Q, the CMP process shown in FIG. 36 may be replaced by an etch-back process which etches back the W layer 20 to leave the planarized W layer. In this case, the etch-back process is performed by two steps including main etching and over-etching both under anisotropic etching conditions, because of a difficulty in forming plugs Ps, Pd and Pk if both etching processes are performed under isotropic etching conditions.

If the etch-back process is performed in the process shown in FIG. 36, a portion of the W layer 20 may be left unetched during the main etching even if the surface of the insulting film 14 is made flat at the process shown in FIG. 32, because of an irregular etching rate over the whole surface of a wafer. Such an unetched W layer 20 may cause an electrical short-circuit between interconnects. Therefore, in order to perfectly remove the W layer 20, the over-etching is performed following the main etching.

Figure 42:
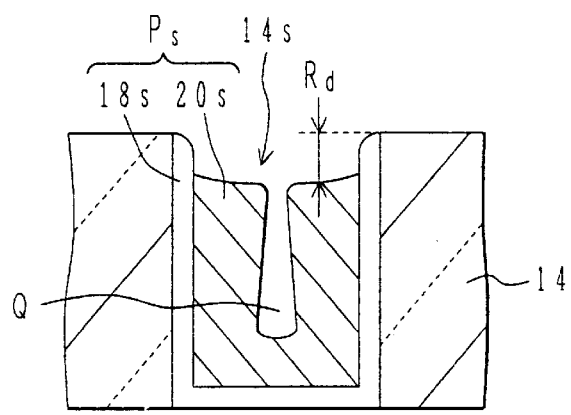
FIG. 42 is a cross sectional view of a substrate illustrating an over-etched W layer.

FIG. 42 illustratively shows the connection hole 14s after over-etching. As shown, the W layer 20s constituting the plug Ps is excessively etched and a recess having a depth Rd is formed on the upper portion of the plug Ps. The opening of the seam or void Q is enlarged more.

Under the conditions that the recess is formed on the upper portion of the plug and the opening of the seam or void Q is enlarged, if the barrier layer 26 is sputtered at the process shown in FIG. 40, the coverage of the barrier layer 26 is degraded at the opening of the seam or void Q and at the step of the recess.

The lowered coverage of the barrier layer 26 at the opening of the seam or void Q may cause the seam or void Q to be exposed to the wiring metal such as Al alloy so that the reliability of interconnections is lowered from the same reason described previously. The lowered coverage of the barrier layer 26 may also degrade the barrier performance and the reliability of interconnections is lowered from the above-described reason.

FIGS. 1 to 11 illustrate a flat wiring layer forming method according to the first embodiment of the invention. The processes (1) to (11) of this method will be described sequentially with reference to corresponding FIGS. 1 to 11.

(1) On the surface of a semiconductor substrate 40 made of, for example, Si (silicon), a field insulating film 42 made of Si oxide and having an element hole 42a is formed by known local oxidation of silicon (LOCOS). After a gate insulating film F is formed through thermal oxidation on the semiconductor surface in the element hole 42a of the insulating film 42, a polysilicon layer or polycide layer (lamination of a lower polysilicon layer and an upper silicide layer formed thereon) is deposited and patterned to form a gate electrode G. If desired, the gate insulating film F may be patterned to the same shape as the gate electrode G.

Next, by using a lamination of the insulating film F and electrode G and the insulating film 42 as a mask, a selective impurity doping process (e.g., ion implantation) is performed to form a source region $S_1$ and a drain region $D_1$ having a relatively lower concentration of impurities having the opposite conductivity type to the substrate. An insulating film of Si oxide or the like is deposited on the substrate, and an etch-back process is performed to form side spacers $H_1$ and $H_2$ on both sides of the gate electrode G.

Thereafter, by using a gate portion GP including the insulating film F, electrode G, side spacers $H_1$ and $H_2$ and the insulating film 42 as a mask, a selective impurity doping process (e.g., ion implantation) is performed to form a source region S and a drain region D having a relatively higher concentration of impurities having the conductivity type opposite to the substrate. With these processes, a source/drain region of a lightly doped drain (LDD) structure is formed.

(2) An interlayer insulating film 44 is formed 0.8 to 1.5 $\mu$m in thickness by sequentially depositing PSG (phosphosilicate glass) and BPSG (borophhosphosilicate glass), the film 44 covering the MOS transistor in the element hole 42a and the insulating film 42. In order to ensure wafer abrasion uniformity and controllability of a CMP process shown in FIG. 3 to be described later, in place of the BPSG film having a low abrading rate, a plasma Si oxide film having a low abrading rate may be formed which is an Si oxide film formed by plasma CVD or an Si oxide film formed by plasma CVD using TEOS (tetraethylorthosilicate).

(3) Since the surface of the insulating film 44 is irregular, reflecting the steps of the underlying layers such as the gate portion GP and insulating film 42, the surface of the insulating film 44 is planarized by CMP.

Materials used for this CMP process are, for example, abrasive liquid formed by suspending abrasive particles of fused silica ($SiO_2$: primary particles) having a diameter of 30 nm in alkalescent liquid containing potassium hydroxide (KOH), ammonium hydroxide ($NH_4OH$) or the like, and polyurethane based abrading or lapping cloth having micro holes in the surface layer thereof. The abrading conditions may be:

Abrasion load: 60–90 kg/wafer (about 350 $g/cm^2$–500 $g/cm^2$);
Platen rotation speed: 30 rpm (common to both (a) and (b));
Head rotation speed: 40 rpm (common to both (a) and (b));
Abrading rate: 150 nm/min (common to both (a) and (b));
Abrasion uniformity: 1 $\sigma$=10 to 20 nm/(removal=500 nm) (common to both (a) and (b)).

Figure 1:
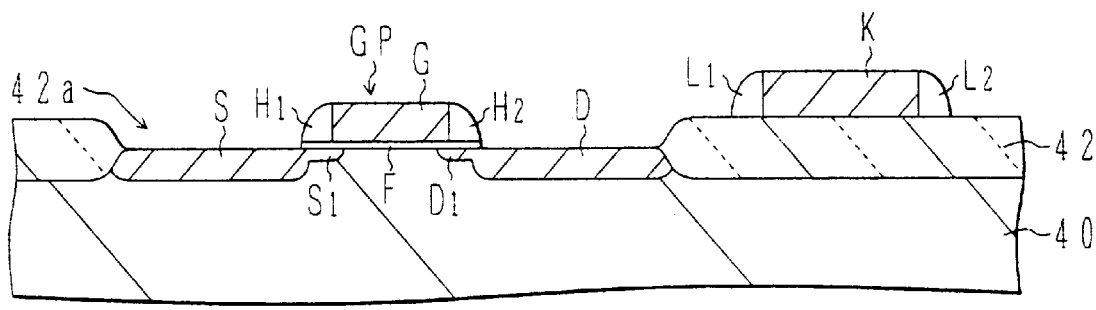
Figure 2:
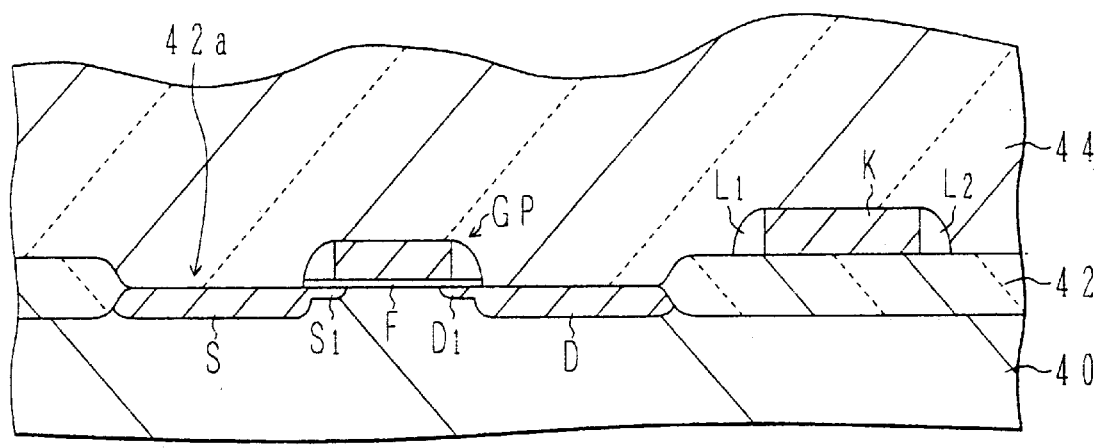
Figure 3:
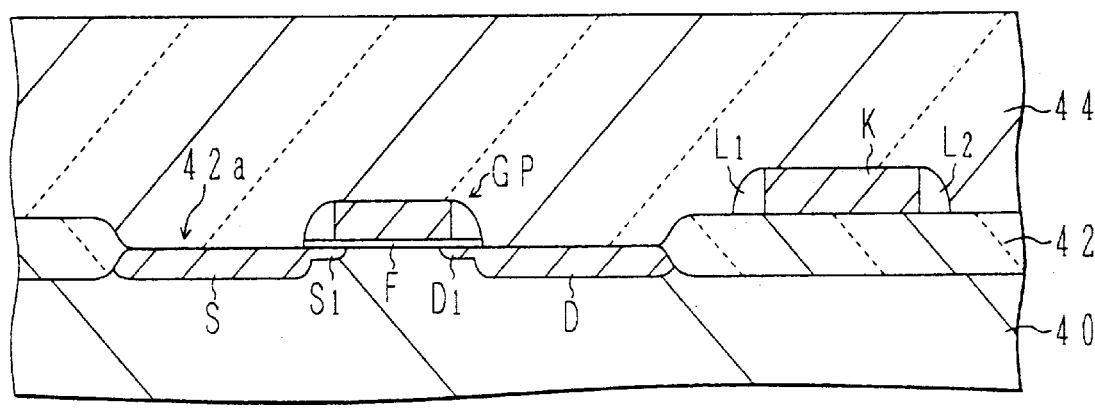

The platen/head rotation ratio of 30/40 is set to improve the abrasion uniformity over the wafer surface. The abrasion uniformity indicates a uniformity when a film is abraded by 500 nm. The surface of the insulating film 44 abraded under the above conditions is flat without any step as shown in FIG. 3.

The abrading mechanism may be considered as a combination of a physical abrading function by the friction between abrasive particles ($SiO_2$) and insulating film 44 and a chemical dissolution/removal function of the insulating film by abrasive liquid (a function of dissolving and removing the material of the insulating film 44 with alkalescent abrasive liquid at a temperature near the wafer surface raised by friction heat).

Other known abrasive particles usable by this CMP process are cerium oxide ($CeO_2$), magnesium dioxide ($MgO_2$), alumina ($Al_2O_3$), manganese dioxide ($MnO_2$) and the like.

(4) A resist pattern 46 having holes 46s, 46d and 46k is formed on the planarized surface of the insulating film 44 by known photolithography. The holes 46s, 46d and 46k correspond to connection holes for the source region S, drain region D and wiring K.

(5) By using the resist pattern 46 as a mask, the insulating film 44 is anisotropically dry-etched to form therein connection holes 44s, 44d and 44k which reach the contact surfaces of the source region S, drain region D and wiring K. Thereafter, the resist pattern 46 is removed.

(6) On the planarized surface of the insulating film 44, a resist pattern 48 having holes 48s and 48d is formed by photolithography. The hole 48s corresponds to an interconnect to the connection hole 44s, and the hole 48d corresponds to an interconnect to the connection holes 44d and 44k.

(7) By using the resist pattern 48 as a mask, the insulating film 44 is anisotropically dry-etched to form therein interconnect grooves 44S and 44D. The interconnect groove 44S is coupled via the connection hole 44s to the source region S, and the interconnect groove 44D is coupled via the connection hole 44d to the drain region D and via the connection hole 44k to the wiring K. The width of the interconnect groove 44S is larger than the diameter of the connection hole 44s, and a step is formed from the bottom of the interconnect groove 44S to the inner wall of the connection hole 44s. The width of the interconnect groove 44D is larger than the diameter of each of the connection holes 44d and 44k, and steps are formed between the bottoms of the interconnect groove 44D to the inner walls of the connection holes 44d and 44k.

Differently from forming the connection holes, in forming the interconnect grooves, an over-etch is not performed. It is not preferable to perform an over-etch because the interconnect grooves become too deep if the over-etch is performed. The etching is controlled to have a sufficient groove depth (500 to 1000 nm), by calculating the etching time required for etching the sufficient groove depth in accordance with the etching rate of the insulating film 44.

Figure 4:
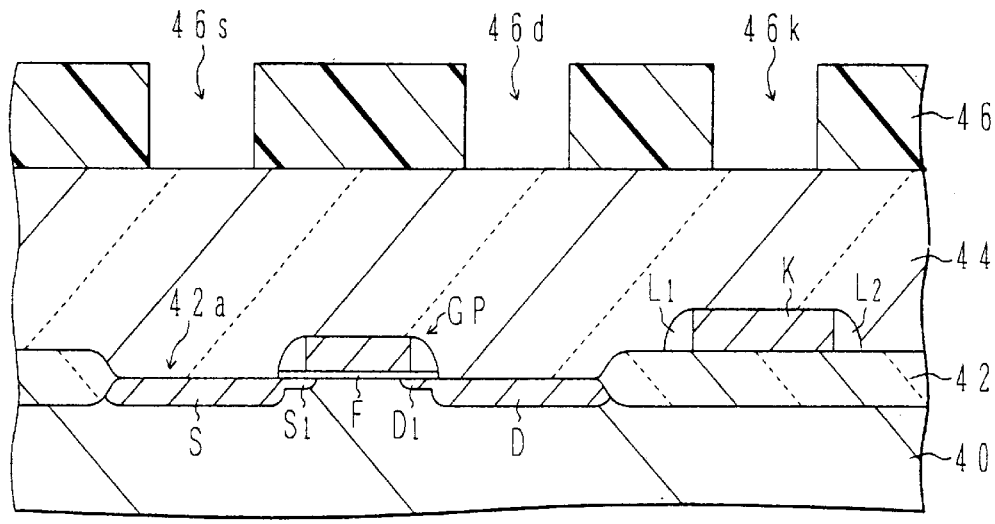
Figure 5:
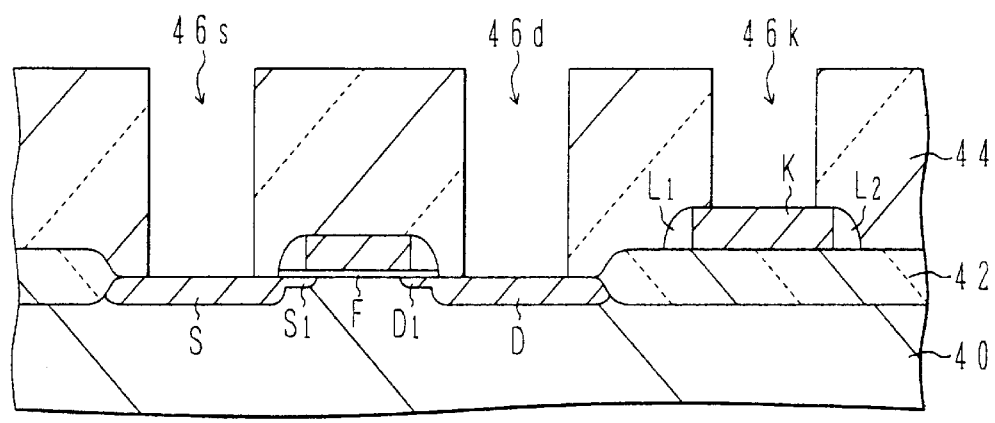
Figure 6:
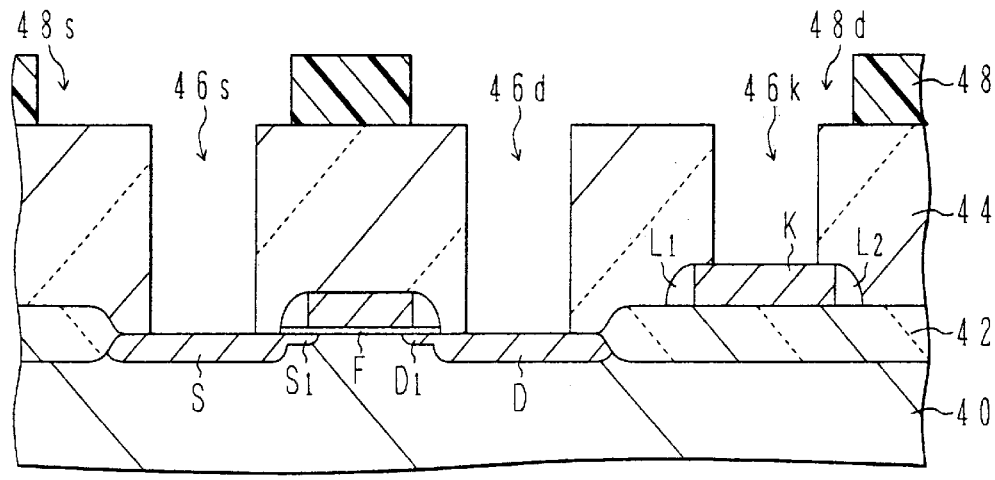
Figure 7:
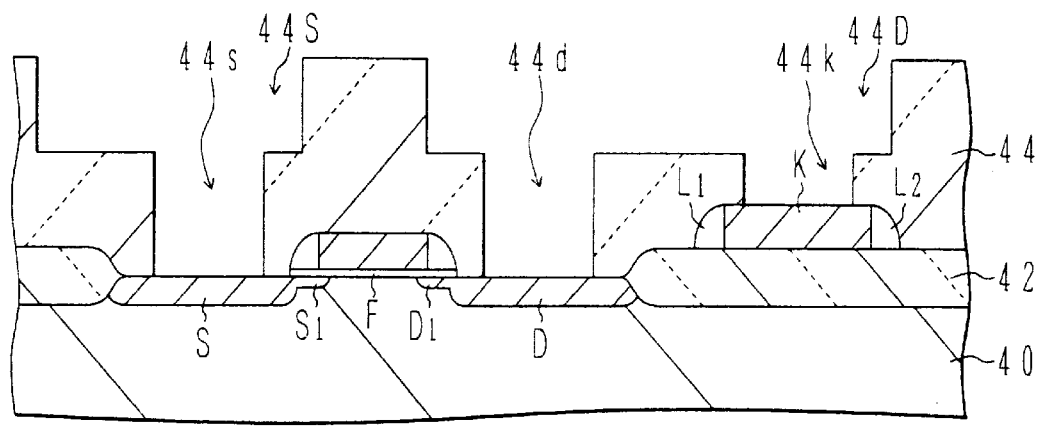

The order of performing the etching process of forming the connection holes shown in FIGS. 4 and 5 and the etching process of forming the interconnect grooves shown in FIGS. 6 and 7 may be reversed.

(8) An adhesion layer 50 constituted of a TiN layer, a TiON layer, a Ti layer or the like is formed by sputtering or CVD, covering the connection holes 44s, 44d and 44k, interconnect grooves 44S and 44D and insulating film 44. For example, the adhesion layer 50 is formed by depositing a TiN film to a thickness of 5 to 50 nm (preferably 20 nm) and depositing a TiN film to a thickness of 50 to 200 nm (preferably 100 nm) on the Ti film. A TiON film may be formed in place of the TiN film.

The Ti film may be formed by sputtering. The sputtering conditions may be:

Substrate temperature: 150° C.
Ar flow rate: 30 sccm
Pressure: 3 mTorr
Sputtering power: 1150 W Collimated sputtering or long throw sputtering is preferably used for the deposition of the Ti film. With such sputtering, a Ti film having a sufficient thickness can be deposited on the bottom of a small contact hole. If CVD is used, a Ti film having an ideal coverage can be formed.

The material of the adhesion layer 50 is not limited to those described above, but other materials may be used including an alloy of refractory metal such as TiW, metal silicide, a lamination of metal silicide and metal nitride such as TiN, and a lamination of refractory metal and its nitride (or boride).

After the adhesion layer 50 is formed, rapid thermal anneal (RTA) such as lamp anneal is performed for 10 to 60 seconds in an $N_2$ atmosphere at a substrate temperature of 500 to 800° C., in order to improve the heat resistance and barrier performance of the adhesion layer 50.

Next, a conductive layer 52 made of conductive material such as W is formed by CVD, covering the connection holes 44s, 44d and 44k, interconnect grooves 44S and 44D and adhesion layer 50. The thickness of the conductive layer 52 is set such that the connection holes 44s, 44d and 44k are filled with the conductive material. More specifically, the connection hole having a radius r can be filled with the conductive layer 52 if it is deposited to a thickness t satisfying $t \geq r$.

The thickness t is set in a range of t=r×1.5 to 2.0. For example, the thickness is set to t=300 to 1000 nm (preferably 400 to 600 nm). The thinner the conductive layer 52, the smaller the load on the film deposition system.

As the material of the conductive layer 52, metal of a kind that has compound gas of a high vapor pressure such as $WF_6$ is selected. The conditions of depositing W by CVD may be:

Substrate temperature: 440° C.
Gas flow rate: $WF_6/H_2/Ar$=80/800/900 sccm
Pressure: 80 Torr Other metals having compound gas of a low boiling point and a high vapor pressure, such as Al, Mo, Ta, Ti, Ni, Cu and Pt may also be used similar to W. Known source gasses of these metals are $(CH_3)_2AlH$ [dimethyl-aluminum-hydride (DMAH) [film forming temperature Td=100 to 300° C.] or $((CH_3)_2CHCH_2)_3Al$ [triisobutyl-aluminum (TIBA) [Td=100 to 300° C.], $MoF_6$ [Td=300 to 800° C.], $TaF_2$ [Td=500 to 800° C.], $TiCl_4$ [Td=350 to 600° C.], $Ni(CO)_4$ [Td=100 to 300° C.], $Pt(CO)_2Cl_2$ [Td=200 to 600° C.] and the like.

As described earlier, a void or seam Q is formed in each of the connection holes 44s, 44d and 44k while the conductive layer 52 is formed.

(9) The conductive layer 52 is thinned by etch-back to leave first, second and third portions of the conductive layer 52 in the connection holes 44s, 44d and 44k as plugs 52s, 52d and 52k and to leave fourth and fifth portions of the conductive layer 52 in the interconnect grooves 44S and 44D as side wall spacers 52S and 52D. Each side wall spacer is formed such that the width of the interconnect groove is gradually narrowed from the opening to bottom of the groove and such that the side wall spacer forms a closed loop covering the side wall and nearby bottom surface of the groove. The etch-back is performed by two steps including main etching and over-etching.

At the main etching step, the conductive layer 52 is anisotropically dry-etched until the adhesion layer 50 is exposed. If the dry etching uses RIE (reactive ion etching), the etching conditions may be:

Gas flow rate: $SF_6/Ar$=30 to 140/40 to 140 (preferably 110/90) sccm
High frequency power: 450 W
Pressure: 32 Pa The timing when the W etching is stopped can be determined by monitoring a radiation intensity of $F^+$ (wavelength of 704 nm) and detecting an increase in the $F^+$ radiation intensity (an increased differential of the radiation intensity).

After the main etching, an over-etch is performed by using the same etcher or different etcher. At this over-etching step, the full thickness of W left on the adhesion layer 50 on the flat surface of the insulating film or in the interconnect groove is completely dry-etched. If the dry etching uses RIE, the etching conditions may be:

Gas flow rate: $SF_6/Ar$=50 to 180/0 to 90 (preferably 8/60) sccm
High frequency power: 200 W
Pressure: 27 Pa In the etch-back process, since the main etching is stopped when the adhesion layer 50 is exposed, it is possible to prevent the plugs 52s, 52d and 52k from excessively protruding from the connection holes 44s, 44d and 44k and from being excessively etched to form the recess such as shown in FIG. 42.

After the over-etching, the exposed adhesion layer 50 may be etched, the detailed process of which will be later described in the second embodiment.

(10) A conductive barrier layer 54 is formed covering the plugs 52s, 52d and 52k, side wall spacers 52S and 52D and exposed adhesion layer 50. This barrier layer 54 can be formed with good coverage because the side walls of the interconnect grooves 44S and 44D are covered with the side wall spacers and the steps are relaxed. Similar to the adhesion layer 50, the barrier layer 54 can be formed by sequentially depositing a Ti layer and a TiN layer (or TiON layer) by sputtering. For example, the Ti layer is deposited 7 nm in thickness and the TiN layer is deposited 50 nm.

The materials of the barrier layer 54 are not limited to those described above, but other materials may be used including an alloy of refractory metal such as TiW, metal silicide, a lamination of metal silicide and metal nitride such as TiN, and a lamination of refractory metal and its nitride (or boride).

After the barrier layer 54 is formed, rapid thermal anneal (RTA) may be performed for 10 to 60 seconds in an $N_2$ atmosphere at a substrate temperature of 500 to 800° C., in order to improve the heat resistance and barrier performance of the barrier layer 54.

Next, a wiring material layer 56 is formed by sputtering or CVD, covering the barrier layer 54 and being inlaid in the interconnect grooves 44S and 44D, and if necessary a reflow process is performed to make the wiring material layer 56 sufficiently fill the interconnect grooves 44S and 44D. Since the barrier layer 54 is formed with good coverage, a void is not formed in the wiring material layer 56 nor diffused into the wiring material layer.

The wiring material layer 56 may be made of an Al layer or an Al alloy layer such as Al-Si and Al-Si-Cu, respectively formed by sputtering. The thickness of this layer 56 is set to 500 to 1500 nm (preferably 1000 nm) if the depths of the interconnect grooves 44S and 44D are 500 nm. The conditions of forming the wiring material layer 56 may be:

Substrate temperature: 200° C.

Ar flow rate: 33 sccm

Pressure: 2 mTorr

Sputtering power: 9000 W

After the layer 56 is formed under the above conditions, the substrate with the layer 56 is heated to 400 to 550° C. to reflow the layer 56 to completely fill the interconnect grooves 44S and 44D with the layer 56.

Even if the layer 56 is formed by sputtering, good coverage can be obtained and voids are not formed at the later reflow process, because the side walls of the interconnect grooves 44S and 44D are covered with the side wall spacers and the steps are relaxed.

If the collimated sputtering or long throw sputtering is used when the layer 56 is formed by sputtering, the interconnect grooves can be filled with the layer 56 with less strict reflow conditions, because a sufficient initial film thickness can be obtained even on the bottom of a small interconnect groove.

Instead of the Al or Al alloy layer, the wiring material layer 56 may be made of Cu or Cu alloy (Cu-Cr, Cu-Zr, Cu-Pd or the like). In this case, a target used for sputtering is replaced by Cu or Cu alloy.

As a film forming method suitable for filling the interconnect grooves 44S and 44D, PVD (physical vapor deposition) or CVD may be used instead of the above-described sputtering-reflow.

If PVD is used, a process of forming a film and a process of filling the groove with the film can be realized at the same time without using a separate reflow process. For example, both the processes can be realized at the same time by high temperature sputtering, by heating the substrate 40 ultimately to a substrate temperature of 400 to 550° C. while Al or Al alloy constituting the wiring material layer 56 is sputtered.

If CVD is used, it is advantageous in that the inside of a small interconnect groove can be filled with the film with good coverage. For example, the film can be formed by using a gas such as dimethyl-aluminum-hydride (DMAH) and an $H_2$ carrier gas under the conditions of a substrate temperature of 100 to 250° C. and a gas flow rate of 200 to 500 sccm. In this case, if the substrate temperature is set low, the Al layer (layer 56) formed does not reflow so that the coverage of the layer 56 is poor and the layer 56 is conformal to the shape of the underlying layer. In this case, after the Al layer (layer 56) is formed, it is reflowed in a vacuum or inert gas atmosphere so that the Al layer can be inlaid in the interconnect grooves 44S and 44D.

(11) A lamination of the adhesion layer 50, barrier layer 54 and wiring material layer 56 is subjected to CMP to form a planarized surface of the lamination. With this CMP, the first portion 50s of the layer 50 is left on the inner surfaces of the interconnect groove 44S and connection hole 44s, and the first portion 54s of the layer 54 and the first portion 56s of the layer 56 are left in the interconnection groove 44S. In addition, the second portion 50d of the layer 50 is left in the inner surfaces of the interconnection groove 44D and connection holes 44d and 44k, and the second portion 54d of the layer 54 and the second portion 56d of the layer 56 are left in the interconnect groove 44D.

Materials used for this CMP process are, for example, abrasive liquid formed by suspending abrasive particles of alumina ($Al_2O_3$: primary particles) having a diameter of 100 nm in weak acid liquid containing oxidant such as $H_2O_2$, and polyurethane based abrading cloth having micro holes in the surface layer thereof. The abrading conditions for Al or Al alloy may be:

Abrasion load: 50 to 90 kg/wafer ($\approx$350 to 500 g/cm$^2$)

Platen rotation speed: 30 rpm

Head rotation speed: 40 rpm

Abrading rate: 300 nm/min

Abrasion uniformity: 1 $\sigma$=10 to 20 nm/(removal=500 nm)

Figure 11:
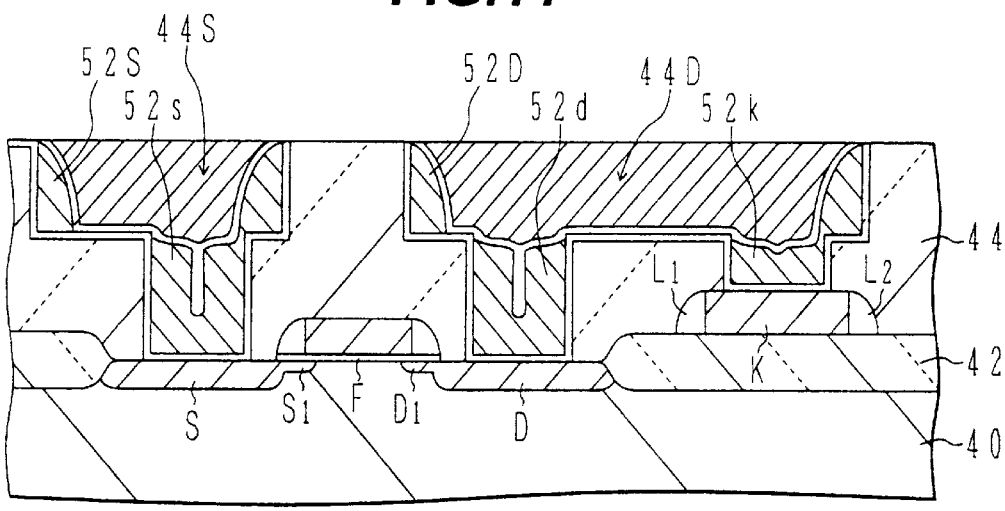

The platen/head rotation ratio of 30/40 is set to improve the abrasion uniformity over the wafer surface. The abrasion uniformity indicates a uniformity when a film is abraded by 500 nm. The surface of the wiring material layer 56 abraded under the above conditions is flat without any step as shown in FIG. 11.

Other abrasive particles may be silica particles or cerium oxide ($CeO_2$). The oxidant is not limited to $H_2O_2$, but iron nitrate ($Fe(NO_3)_3$) or manganese dioxide ($MnO_2$) or the like may be used.

The above-described abrading conditions may be applied not only to Al or Al alloy, but also to Cu or Cu alloy.

The timing of stopping CMP can be detected by monitoring the amount of material of the adhesion layer 50 contained in abrasion waste. Specifically, while the wiring material layer 56 is abraded, the material of the adhesion layer 50 will not be drained to the abrasion waste. After the CMP for the wiring material layer 56 is completed at the surface level of the barrier layer 54 over the flat surface of the insulating film 44, the barrier layer 54 is then abraded and thereafter the adhesion layer 50 is abraded when a large amount of the material of this layer 50 is drained to the abrasion waste and the concentration increases sharply. Thereafter, as the adhesion layer 50 formed on the side walls of the interconnect grooves 44S and 44D is abraded, the concentration of the material of the layer 50 drained to the abrasion waste lowers considerably. It is therefore possible to correctly detect the timing of stopping the CMP process by monitoring the concentration of the material of the layer 50 drained to the abrasion waste.

With the above CMP process, a wiring layer 58S connected to the source region S and a wiring layer 58D locally interconnecting the drain region D and wiring K can be formed. The wiring layer 58S is constituted of the left portion 50s of the adhesion layer 50, plug 52s, side wall spacer 52S, left portion 54s of the barrier layer 54, and left portion 56s of the wiring material layer 56. The wiring layer 58D is constituted of the left portion 50d of the adhesion layer 50, plugs 52d and 52k, side wall spacer 52D, left portion of the barrier layer 54, and left portion 56d of the wiring material layer 56.

As described above, an interconnect groove having a predetermined depth and a plug hole extending downward from the interconnect groove are formed in the insulating layer, and after the conductive layer is embedded in the groove and holes, it is etched back to form a plug and a side wall spacer on the side wall of the groove, the latter relaxing the step between the groove and holes. Thereafter, a barrier layer and a conductive layer are deposited and subjected to CMP to form electrically separated wiring layers whose surfaces are flush with the surface of the insulating film.

FIGS. 12 to 16 illustrate a flat wiring layer forming method according to the second embodiment of the invention. The features of the second embodiment reside firstly in that a process of etching the adhesion layer 50 is added and secondary in that a portion of a cap layer 60 is left as a portion of a wiring layer.

Figure 9:
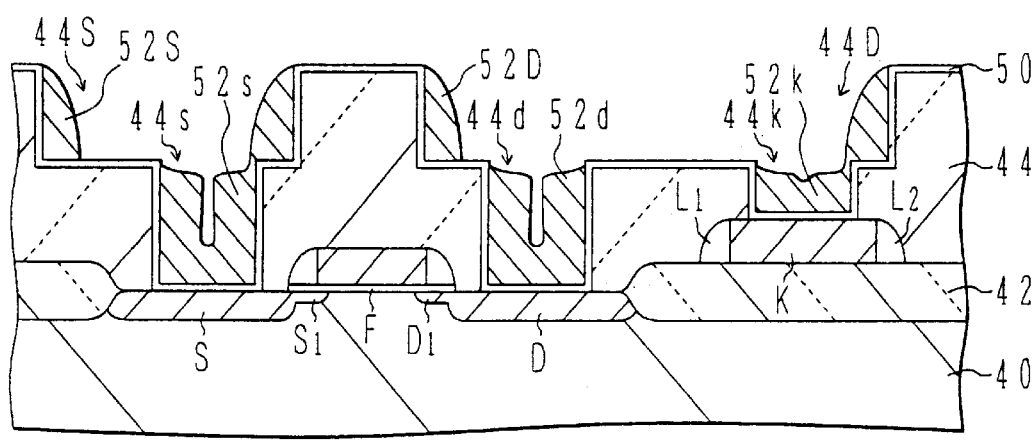
Figure 12:
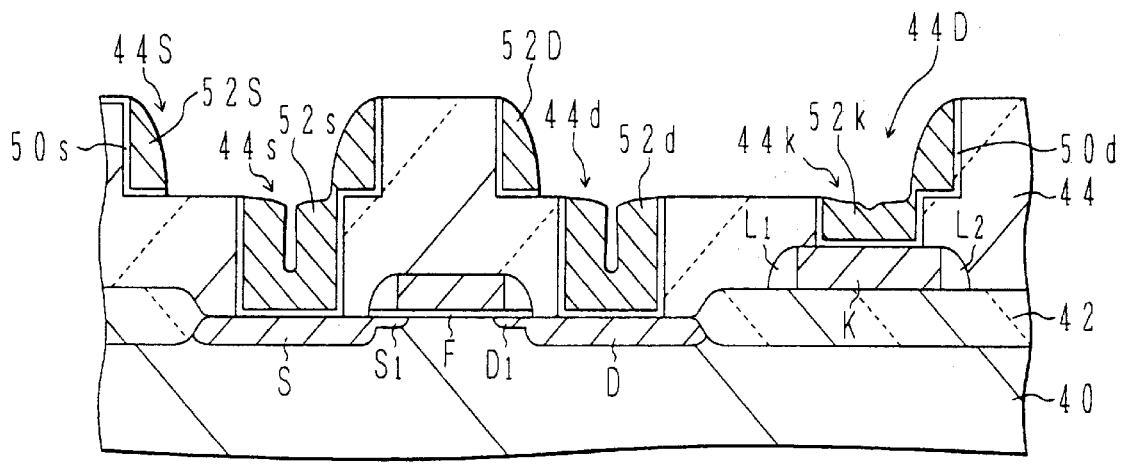

In the process shown in FIG. 12, the adhesion layer 50 is etched after the over-etching process shown in FIG. 9. This etching is preferably performed in another chamber of the same multi-chamber etcher as used by the main etching, or may be performed by another etcher.

The adhesion layer 50 exposed on the flat portion of the insulating film 44 and in the interconnect grooves 44S and 44D is dry-etched, for example, by RIE. If the adhesion layer 50 is made of a lamination of TiN/Ti (Ti is a lower layer), the etching conditions may be:

Gas flow rate: $Cl_2$=10 to 50 (preferably 10) sccm
High frequency power: 250 W
Pressure: 27 Pa This dry etching is performed until the insulating film 44 is exposed, to leave the first portion 50s of the adhesion layer 50 in the interconnect groove 44S and connection hole 44s and to leave the second portion 50d of the layer 50 in the interconnect groove 44D and connection holes 44d and 44k. Since the adhesion layer 50 exposed on the flat portion of the insulating film 44 is removed, the layer 50 on the flat portion of the insulating film 44 is not necessary to be removed at a CMP process shown in FIG. 14 to be described later.

Figure 10:
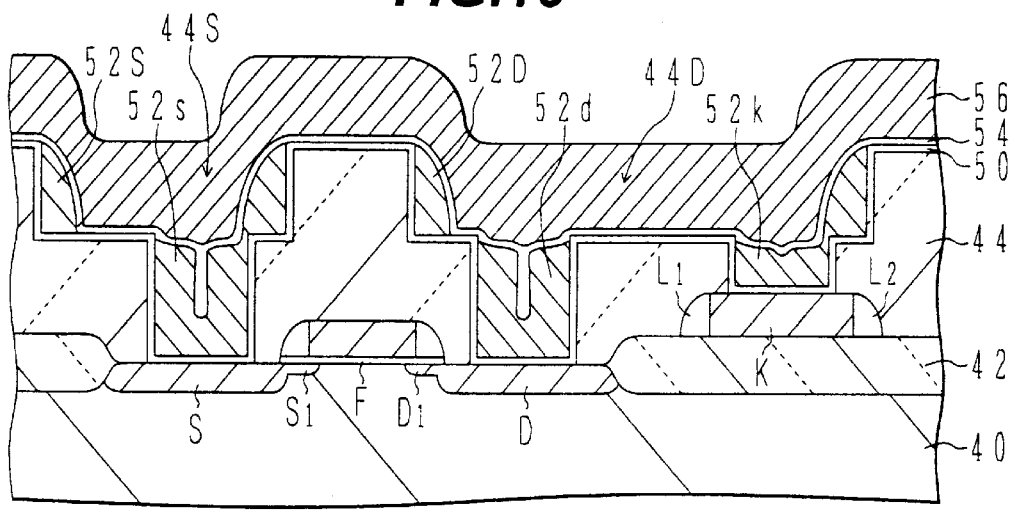
Figure 13:
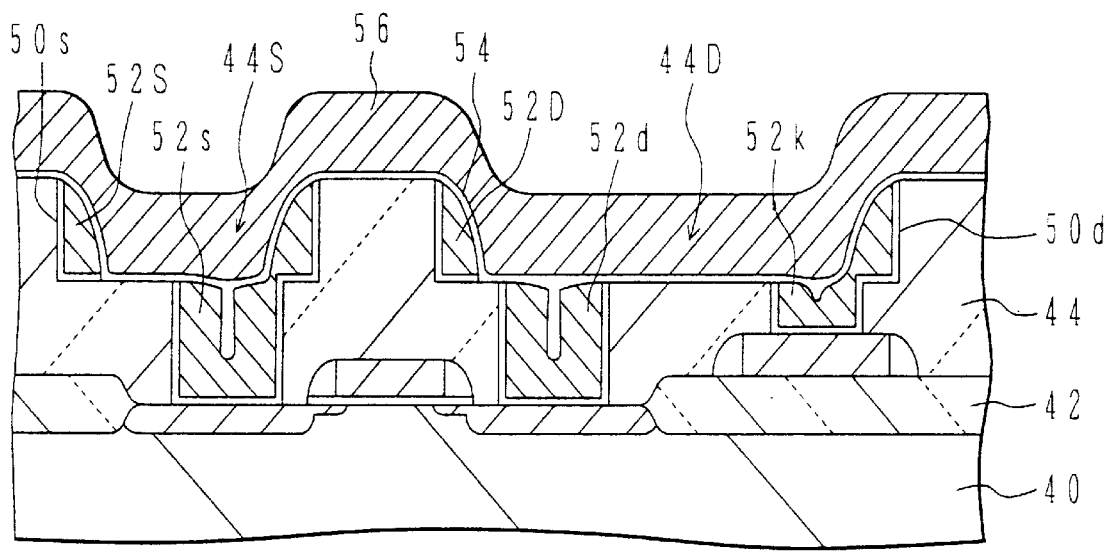

Next, in the process shown in FIG. 13, similar to the case described with FIG. 10, a conductive barrier layer 54 and a wiring material layer 56 are sequentially deposited, covering the plugs 52s, 52d and 52k, side wall spacers 52S and 52D and exposed insulating film 44. In this case, similar to the first embodiment, both the barrier layer 54 and wiring material layer 56 can be formed with good coverage.

Figure 14:
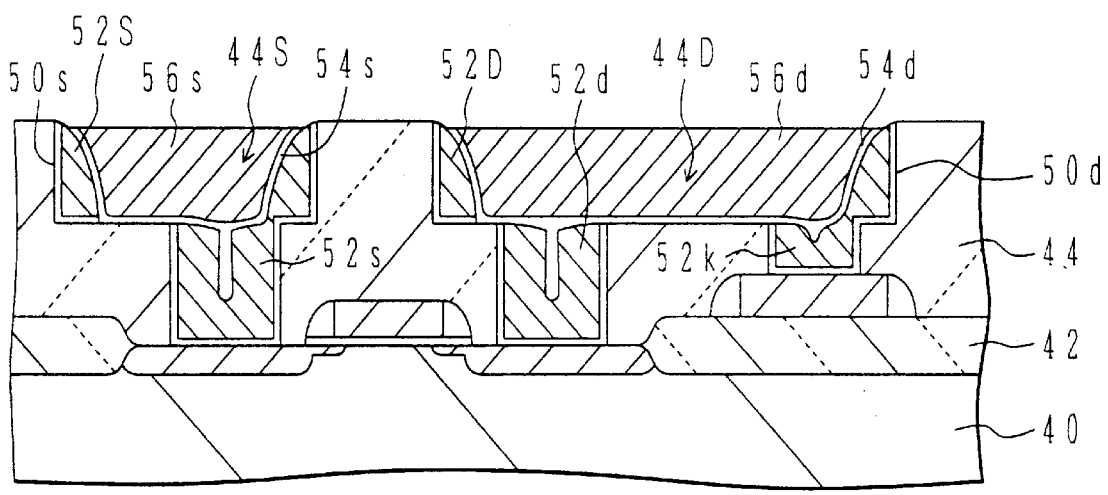

In the process shown in FIG. 14, a lamination of the barrier layer 54 and wiring material layer 56 is partially removed by CMP to planarize the surface thereof, to leave the first portion 54s of the layer 54 and the first portion 56s of the layer 56 in the interconnect groove 44S and to leave the second portion 54d of the layer 54 and the second portion 56d of the layer 56 in the interconnect groove 44D. In this CMP process, the flat level of a lamination of the layers 54 and 56 is made deeper, for example, by 30 to 100 (preferably 50) nm than the opening level of each of the interconnect grooves 44S and 44D.

This CMP process is generally the same as that described with FIG. 11. However, the timing of stopping the CMP process is changed. Namely, excessive CMP is performed after the monitored concentration of material of the barrier layer 54 drained to abrasion waste rapidly increases and thereafter reduces (an ordinary CMP end point).

The time period while the excessive CMP is performed may be determined empirically or may be determined from the following calculations in order to perform the excessive CMP more reliably. Namely, the abrasion rate is calculated from the time period from the abrasion start to the ordinary CMP end point timing, and in accordance with the calculated abrasion rate, an abrasion time required to reach a target depth is calculated.

The left adhesion layer portions 50s and 50d near at the openings of the interconnect grooves 44S and 44D are sandwiched between the plug metal (side wall spacers 52S and 52D) of a high rigidity such as W and the insulating film 44. Therefore, even if the excessive CMP process is performed, these left adhesion layer portions are hardly abraded and remain to be left as they are.

Figure 15:
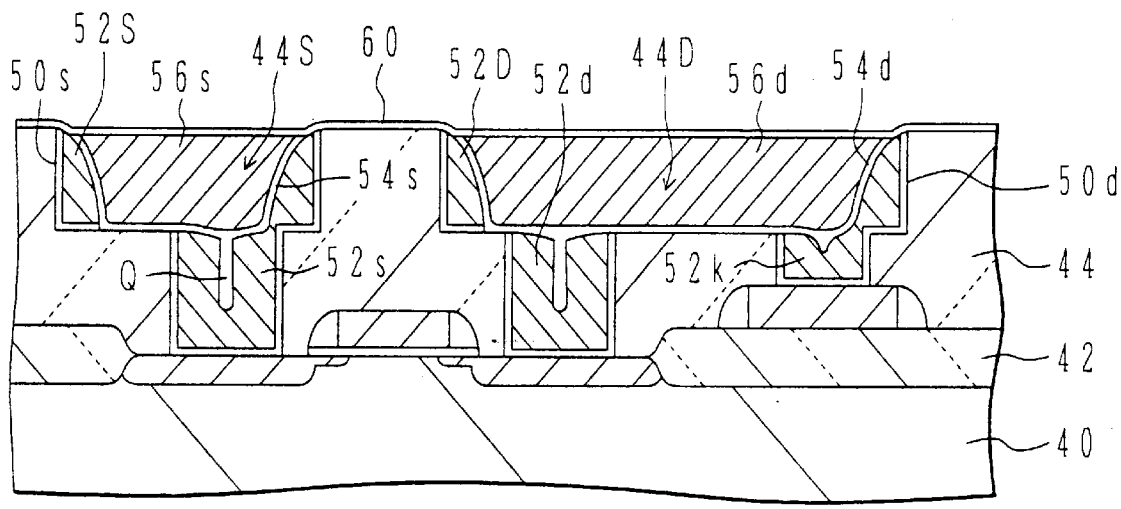

Next, in the process shown in FIG. 15, a cap layer 60 is formed covering the interconnect grooves 44S and 44D and exposed insulating film 44. For example, the cap layer 60 can be formed by sequentially forming a Ti film to a thickness of 3 to 50 (preferably 7) nm and a TiN film to a thickness of 20 to 100 (preferably 40) nm, respectively by sputtering. The Ti film sputtering conditions may be:

Substrate temperature: 150° C.
Ar flow rate: 30 sccm
Pressure: 3 mTorr
Sputtering power: 1150 W The TiN layer is preferably formed in succession after the formation of the Ti layer by using the same sputtering system. The TiN film sputtering conditions may be:

Substrate temperature: 150° C.
Gas flow rate: $Ar/N_2$=56/84 sccm
Pressure: 4 mTorr
Sputtering power: 5300 W Collimated sputtering, long throw sputtering or CVD may be used for depositing the Ti layer and TiN layer.

After the cap layer 60 is formed, rapid thermal anneal (RTA) may be performed for 10 to 60 seconds in an $N_2$ atmosphere at a substrate temperature of 500 to 800° C., in order to improve the heat resistance and barrier performance of the cap layer 60. Afterward, another insulating layer such as silicon oxide will be formed thereon.

The materials of the cap layer 60 are not limited to those described above, but other materials may be used including an alloy of refractory metal such as TiW, metal silicide, a lamination of metal silicide and metal nitride such as TiN, and a lamination of refractory metal and its nitride (or boride).

The cap layer 60 is used for improving the reliability of the wiring material layer 56 made of Al or Al alloy or Cu or Cu alloy, by preventing the surface oxidation of the wiring material layer and increasing a resistance to electromigration. If Cu or Cu alloy is used as the material of the wiring material layer 56, the cap layer 60 functions as a barrier layer for preventing oxidation by oxygen diffused from the insulating layer or preventing Cu from diffusing into the insulating layer. It is therefore necessary to cover Cu containing wiring material much more reliably with the cap layer 60. It is therefore preferable to form the cap layer 60 thicker if Cu containing wiring material is used, than if Al or Al alloy is used as the material of the wiring material layer 56.

Figure 16:
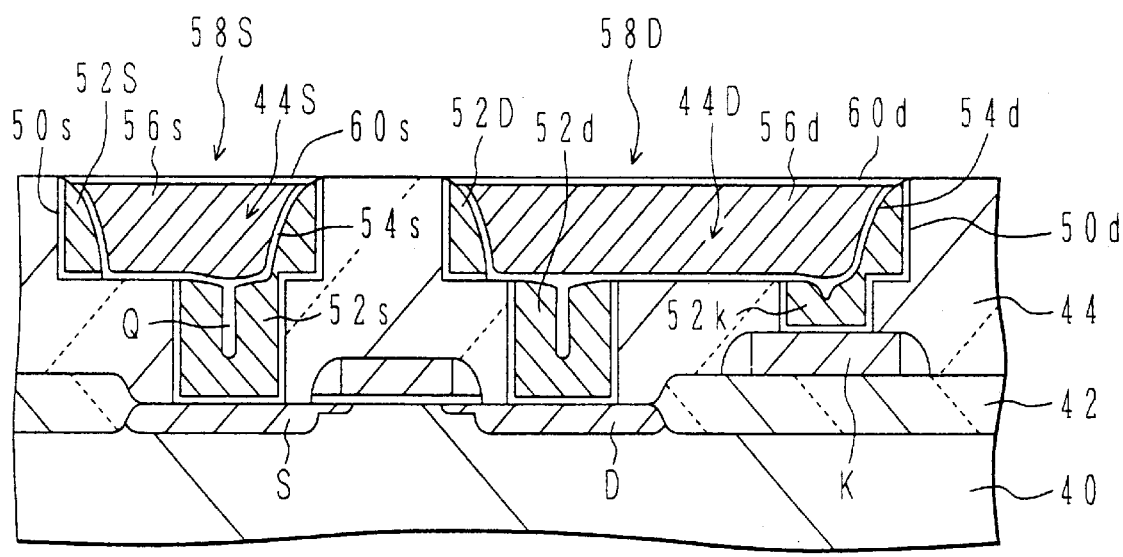

Next, in the process shown in FIG. 16, the cap layer 60 is partially removed by CMP to planarize the surface thereof, to leave the first and second portions 60s and 60d of the cap layer 60 in the interconnect grooves 44S and 44D, respectively. This CMP process may be performed under the same conditions described with FIG. 11.

This CMP process stops when the flat portion of the insulating film 44 is exposed. Since the abrasion rate of the insulating film 44 is slow, the CMP process can be easily stopped when the flat portion of the insulating film 44 is exposed. The thickness of the left cap layers 60s and 60d can be controlled in accordance with the recess depth in the interconnect grooves at the process shown in FIG. 14, the thickness of the cap layer 60 at the process shown in FIG. 15, the abrasion amount of the cap layer 60 at the process shown in FIG. 16, and other parameters.

If the timing of stopping the CMP process shown in FIG. 16 is to be detected strictly, the concentration of material of the cap layer 60 drained to abrasion waste is monitored. Specifically, after the cap layer 60 on the flat portion of the insulating film 44 is completely removed by the CMP process, the area of the cap layer 60 to be abraded reduces and the concentration of material of the layer 60 drained to the abrasion waste lowers. This timing of the lowered concentration is detected.

With this CMP process, an interconnect layer 58S connected to the source region S and an interconnect layer 58D locally interconnecting the drain region D and wiring K can be obtained. The interconnect layer 58S is constituted of the left portion 50s of the adhesion layer 50, plug 52s, side wall spacer 52S, left portion 54s of the barrier layer 54, left portion 56s of the wiring material layer 56, and left portion 60s of the cap layer 60. The interconnect layer 58D is constituted of the left portion 50d of the adhesion layer 50, plugs 52d and 52k, side wall spacer 52D, left portion 54d of the barrier layer 54, left portion 56d of the wiring material layer 56, and left portion 60d of the cap layer 60.

In this embodiment, since the adhesion layer on the insulating film is removed by the etch-back process, the CMP process can be simplified. Furthermore, since the cap layer is formed on the wiring material layer, the reliability of the wiring material layer can be improved.

FIGS. 17 to 23 illustrate a flat wiring layer forming method according to the third embodiment of the invention. The features of the second embodiment reside firstly in that interconnect grooves and connection holes are formed by a single etching process by using resist patterns 62 and 64 as a mask and secondary in that a conductive material layer 52 is anisotropically etched back and thereafter a void or seam Q is taper-etched to enlarge the void or seam Q toward the opening thereof.

Figure 17:
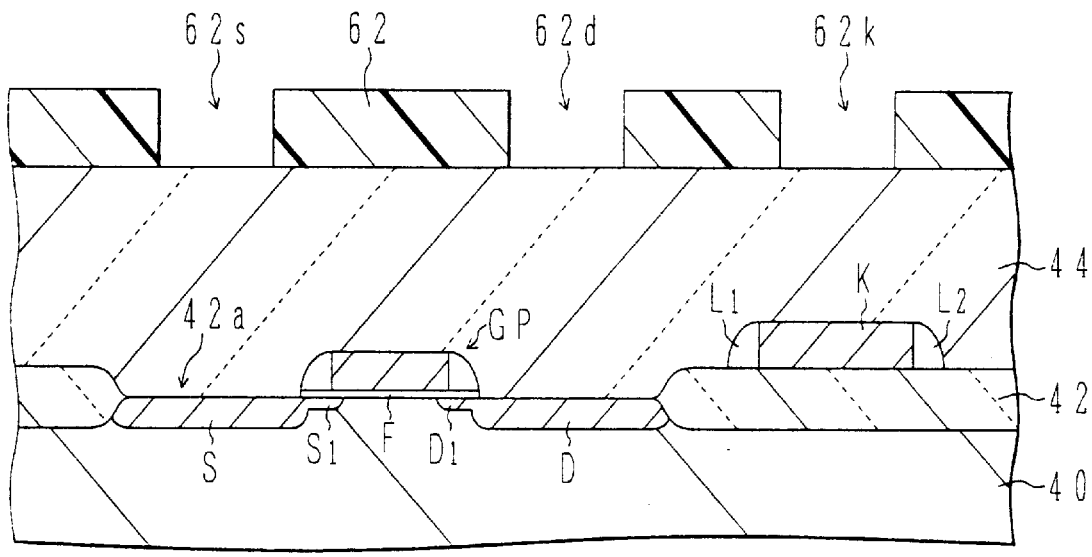

In the process shown in FIG. 17, a resist pattern 62 having holes 62s, 62d and 62k is formed by photolithography on the planarized surface of the insulating film 44 after the CMP process shown in FIG. 3. The holes 62s, 62d and 62k correspond to connection holes coupled to the contact surfaces of the source region S, drain region D and wiring K. The resist pattern 62 is subjected to heat treatment at about 150° after the development, or is subjected to both the heat treatment and an ultraviolet radiation process. This is performed in order to cure the resist pattern 62 on which another resist pattern is to be formed.

Figure 18:
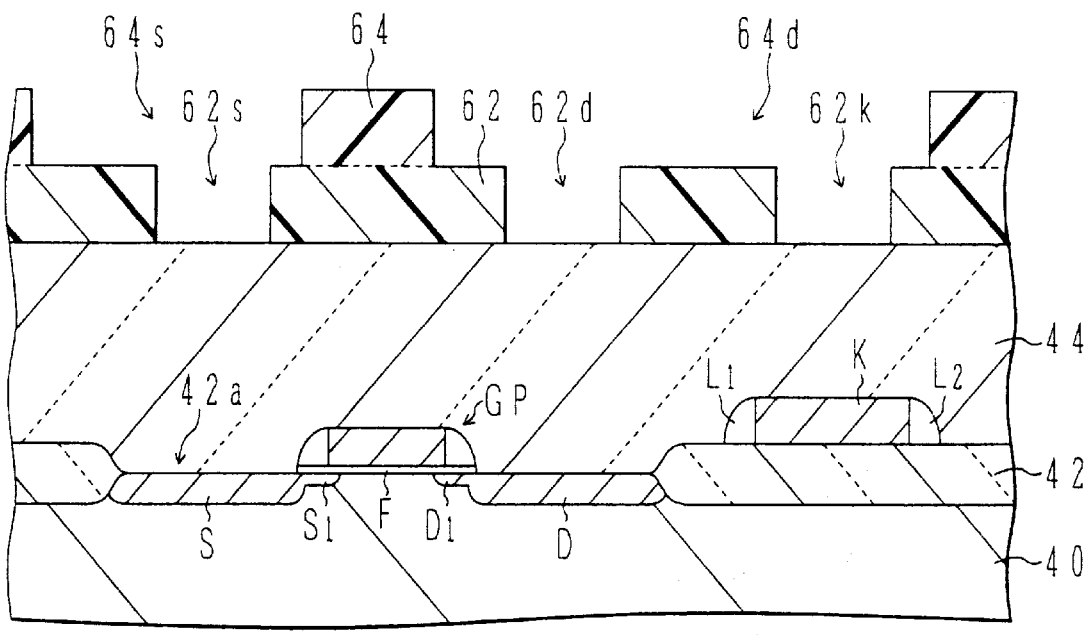

Next, in the process shown in FIG. 18, on the resist pattern 62, another resist pattern 64 having holes 64s and 64d is formed by photolithography. The hole 64s corresponds to an interconnect groove coupled to the contact surface of the source region S, and the hole 64d corresponds to an interconnect groove coupled to the contact surfaces of the drain region D and wiring K.

The resist patterns may be formed by coating two resist layers having different photosensitive wavelengths, by patterning the upper resist layer to have an interconnect groove pattern, and by patterning the lower resist layer to have a connection hole pattern. Alternatively, the resist patterns may be formed by coating a lower resist layer, by coating on the lower resist layer an upper resist layer containing compounds which absorb light of a photosensitive wavelength of the lower resist layer, by patterning the upper resist layer to have the interconnect groove pattern while preventing the lower resist pattern from being exposed to the light, and by patterning the lower resist layer to have the connection hole pattern.

Figure 19:
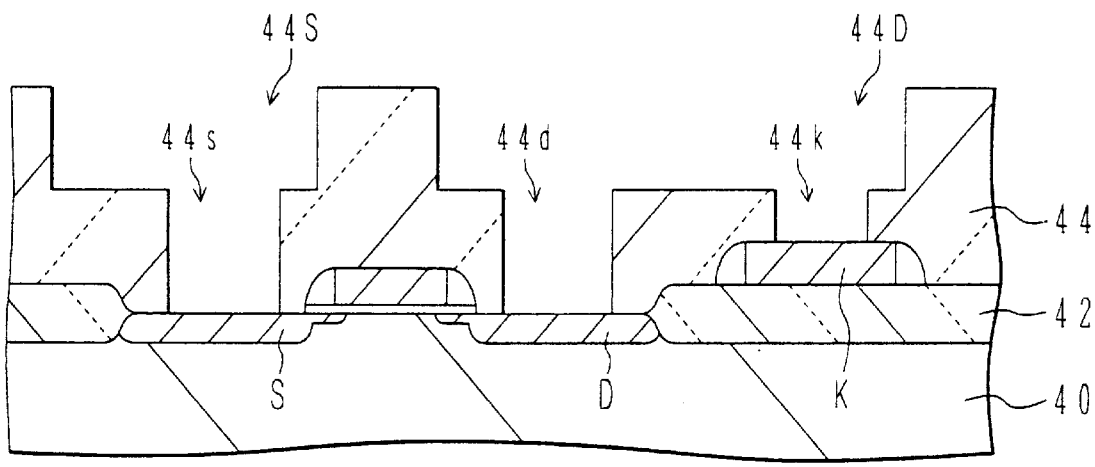

Next, in the process shown in FIG. 19, by using the resist patterns 62 and 64 as a mask, the insulating film 44 is anisotropically etched to form connection holes 44s, 44d and 44k and interconnect grooves 44S and 44D by a single etching process.

In this case, it is preferable to etch both the resist patterns 62 and 64 and insulating film 44 at nearly the same etching rate. If such etching is to be performed by using a magnetron RIE system, the etching conditions may be:

Etching gas: $SF_6/CHF_3$=5 to 30/95 to 70 (preferably 15/85) sccm
Pressure: 50 to 300 (preferably 125) mTorr
Power: 400 to 700 (preferably 550) W
Magnetic field: 100 Gauss Under these dry-etching conditions, the insulating film 44 in the areas of the holes 62s, 62d and 62k of the resist pattern 62 is first etched, and at the same time the resist pattern 62 in the areas exposed in the holes 64s and 64d of the resist pattern 64 is removed and the resist pattern 64 is removed. In succession, as the insulating film 44 in the areas of the holes 64s and 64d of the resist pattern 64 is removed by using the left resist pattern 62 as a mask, the left resist pattern 62 is etched and removed. As a result, the connection hole pattern of the resist pattern 62 and the interconnect groove pattern of the resist pattern 64 can be correctly transferred to the insulating film 44.

An over-etch is not performed because the interconnect grooves are etched too deep if it is performed. The etching is controlled by calculating from the etching rate of the insulating film 44 an etching time taken to etch the film 44 to a necessary depth (e.g., 500 to 1000 nm) which allows the connection holes 44s, 44d and 44k to reliably reach the contact surfaces of the source region S, drain region D and wiring K.

Figure 8:
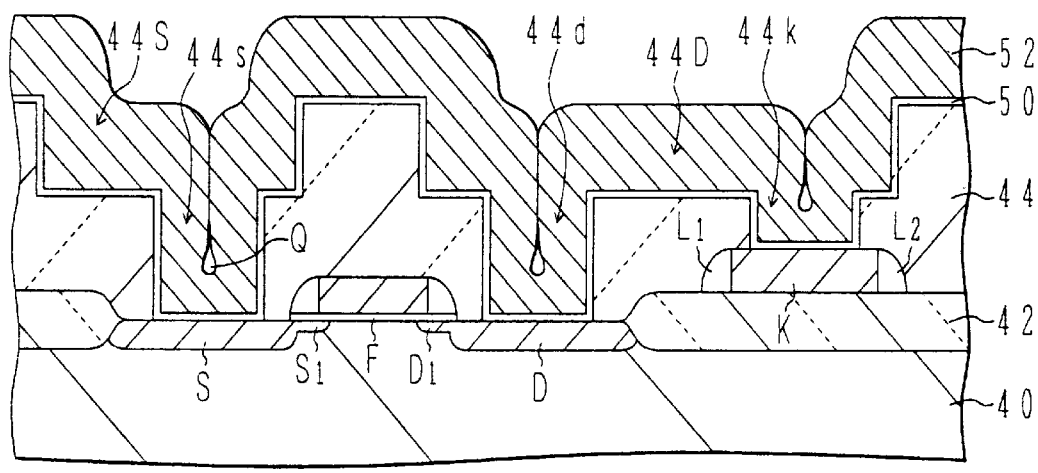
Figure 20:
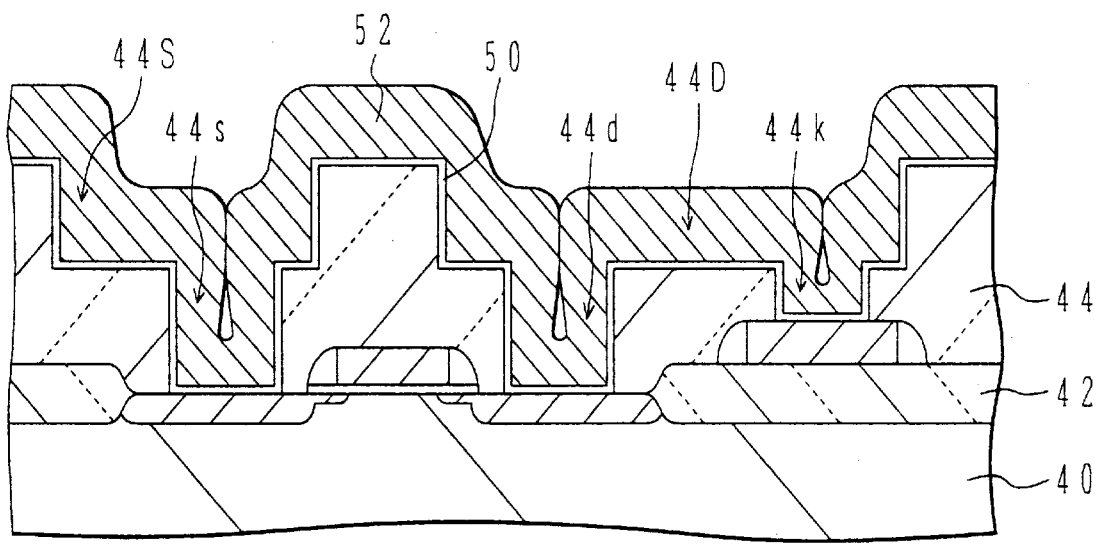

In the process shown in FIG. 20, similar to the process described with FIG. 8, an adhesion layer 50 and a conductive material layer 52 are sequentially formed covering the connection holes 44s, 44d and 44k, interconnect grooves 44S and 44D and insulating film 44. While the conductive material layer 52 is formed, a void or seam Q is formed in each of the connection holes 44s, 44d and 44k.

Figure 21:
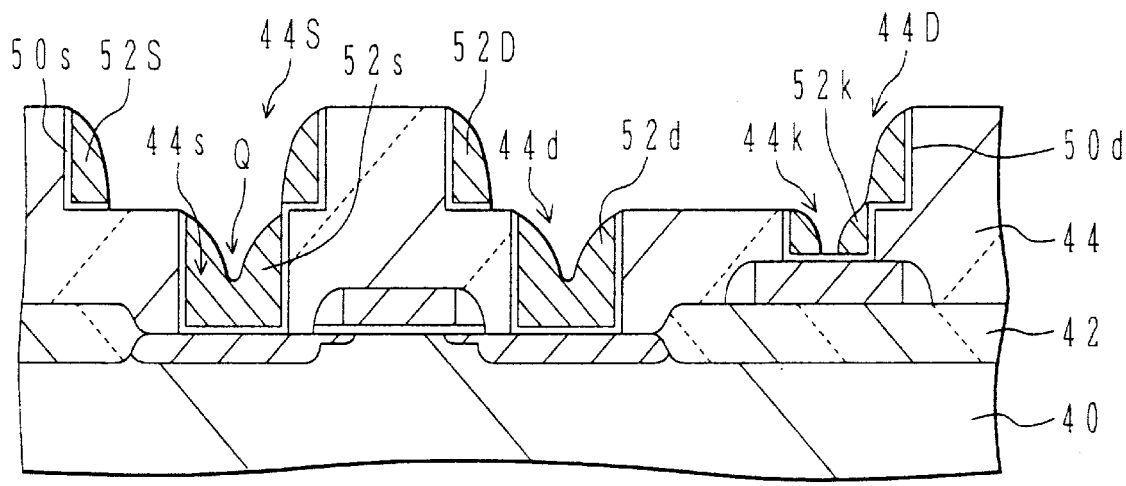

Next, in the process shown in FIG. 21, the conductive layer 52 is etched back and thinned to leave first, second and third portions of the conductive material layer 52 in the connection holes 44s, 44d and 44k as plugs 52s, 52d and 52k and to leave fourth and fifth portions of the conductive material layer 52 in the interconnect grooves 44S and 44D as side wall spacers 52S and 52D. Each side wall spacer is formed such that the side wall spacer forms a closed loop covering the adhesion layer 50 on the side wall of the interconnect groove. The etch-back is performed by two steps including main etching and over-etching.

At the main etching step, the conductive layer 52 is anisotropically dry-etched until the adhesion layer 50 is exposed. If the dry etching uses RIE (reactive ion etching), the etching conditions may be set to those described in the process shown in FIG. 9.

Next, the exposed adhesion layer 50 on the flat portion of the insulating film 44 and in the interconnect grooves 44S and 44D is dry-etched, for example, by RIE. This etching may be performed by the same etcher used for etching the conductive material layer 52, or by a different etcher. The etching conditions may be set to those described in the process shown in FIG. 12.

This dry etching is performed until the insulating film 44 is exposed, to leave a first portion 50s of the adhesion layer 50 in the interconnect groove 44S and connection hole 44s and to leave a second portion 50d of the layer 50 in the interconnect groove 44D and connection holes 44d and 44k. The cross section of the substrate is the same as that shown in FIG. 12. The process of etching the adhesion layer 50 may be omitted if desired.

After the main etching described above, an over-etch is performed by using the same etcher or a different etcher. At this over-etching step, taper-etching is performed so that each void or seam Q is enlarged to have a diameter gradually increasing from the bottom to opening end (a side wall inclination angle of each void or seam Q becomes smaller than 90° (so-called a normal taper or an inverted cone taper), and dry-etching is performed under the isotropic etching conditions to completely remove W left unetched.

In order to shorten an etching time, it is preferable to perform the over-etch in the same etcher as that used by the main etching, under the different etching conditions. The etching conditions may be:

Gas flow rate: $SF_6/Ar/O_2$=50 to 180/0 to 90/0 to 50 (preferably 140/0/5) sccm High frequency power: 200 W Pressure: 27 Pa $O_2$ gas is added to facilitate the taper-etching of the void or seam Q. Instead of $O_2$, other gasses such as $H_2O$ and $O_3$ (ozone) capable of supplying oxygen may be used.

With this over-etch, the void or seam Q increases its diameter from the bottom to opening end as shown in FIG. 21 so that the void or seam Q can be easily filled with a wiring material layer to be later formed.

Figure 22:
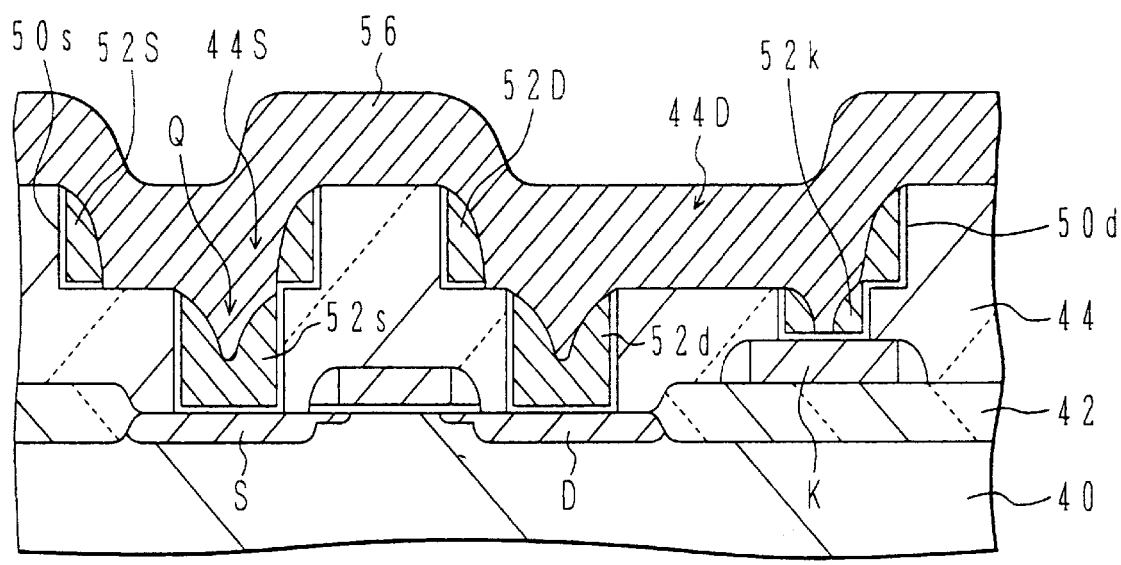

Next, in the process shown in FIG. 22, a wiring material layer 56 is formed by sputtering, CVD or the like, covering the plugs 52s, 52d and 52k, side wall spacers 52S and 52D and exposed insulating film 44, and if necessary a reflow process is performed to sufficiently fill the interconnect grooves 44S and 44D and voids or seams Q with the wiring material layer 56.

The wiring material layer 56 may be formed by sputtering Al or Al alloy such as Al-Si and Al-Si-Cu. The thickness of this layer 56 is set to 500 to 1500 nm (preferably 1000 nm) if the depths of the interconnect grooves 44S and 44D are 500 nm. The conditions of forming the wiring material layer 56 may be:

Substrate temperature: 200° C.

Ar flow rate: 33 sccm

Pressure: 2 mTorr

Sputtering power: 9000 W

After the layer 56 is formed under the above conditions, the substrate with the layer 56 is heated to 400 to 550° C. to reflow the layer 56 to completely fill the interconnect grooves 44S and 44D and voids or seams Q with the layer 56.

Even if the layer 56 is formed by sputtering, good coverage can be obtained and voids are not formed at the later reflow process, because the side walls of the interconnect grooves 44S and 44D are covered with the side wall spacers and the steps are relaxed.

If the collimated sputtering or long throw sputtering is used when the layer 56 is formed by sputtering, the interconnect grooves can be filled with the layer 56 under the less strict reflow conditions, because a sufficient initial film thickness can be obtained even on the bottom of a small interconnect groove.

Instead of the Al or Al alloy layer, the wiring material layer 56 may be made of Cu or Cu alloy (Cu-Cr, Cu-Zr, Cu-Pd or the like). In this case, a target used for sputtering is replaced by Cu or Cu alloy.

As a film forming method suitable for filling the interconnect grooves 44S and 44D and voids or seams Q, PVD (physical vapor deposition) or CVD may be used similar to the case described in the process of FIG. 10.

Figure 23A:
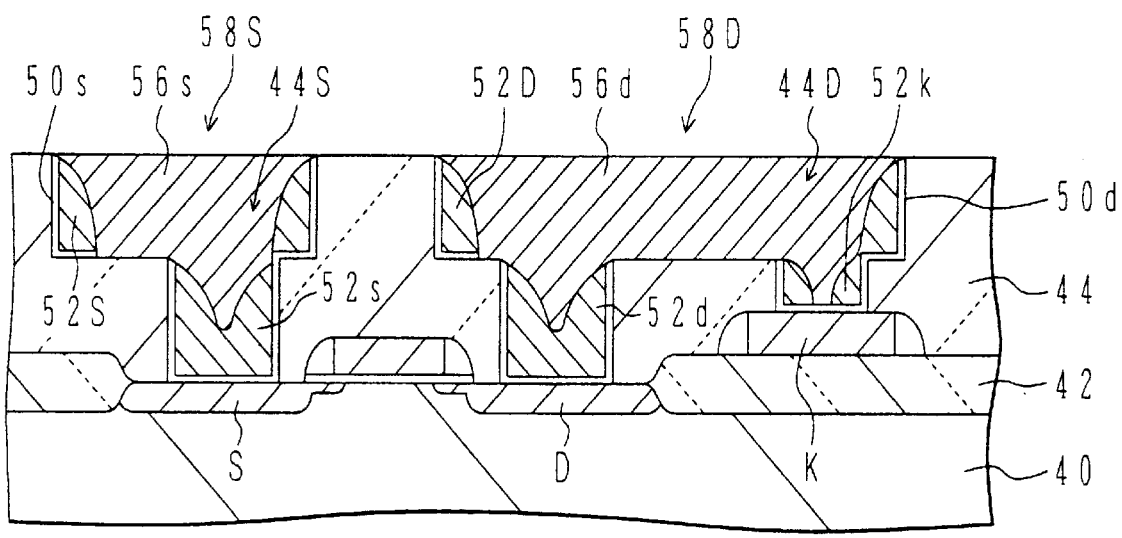
FIGS. 23A–23B illustrates a CMP process.

Next, in the process shown in FIG. 23A, the wiring material layer 56 is partially removed by a CMP process to leave first and second portions 56s and 56d of the layer 56 in the interconnect grooves 44S and 44D. This CMP process can be performed similar to the case described with FIG. 11.

With the above CMP process, a wiring layer 58S connected to the source region S and a wiring layer 58D locally interconnecting the drain region D and wiring K can be formed. The wiring layer 58S is constituted of the left portion 50s of the adhesion layer 50, plug 52s, side wall spacer 52S, and left portion 56s of the wiring material layer 56. The wiring layer 58D is constituted of the left portion 50d of the adhesion layer 50, plugs 52d and 52k, side wall spacer 52D, and left portion 56d of the wiring material layer 56.

Figure 23B:
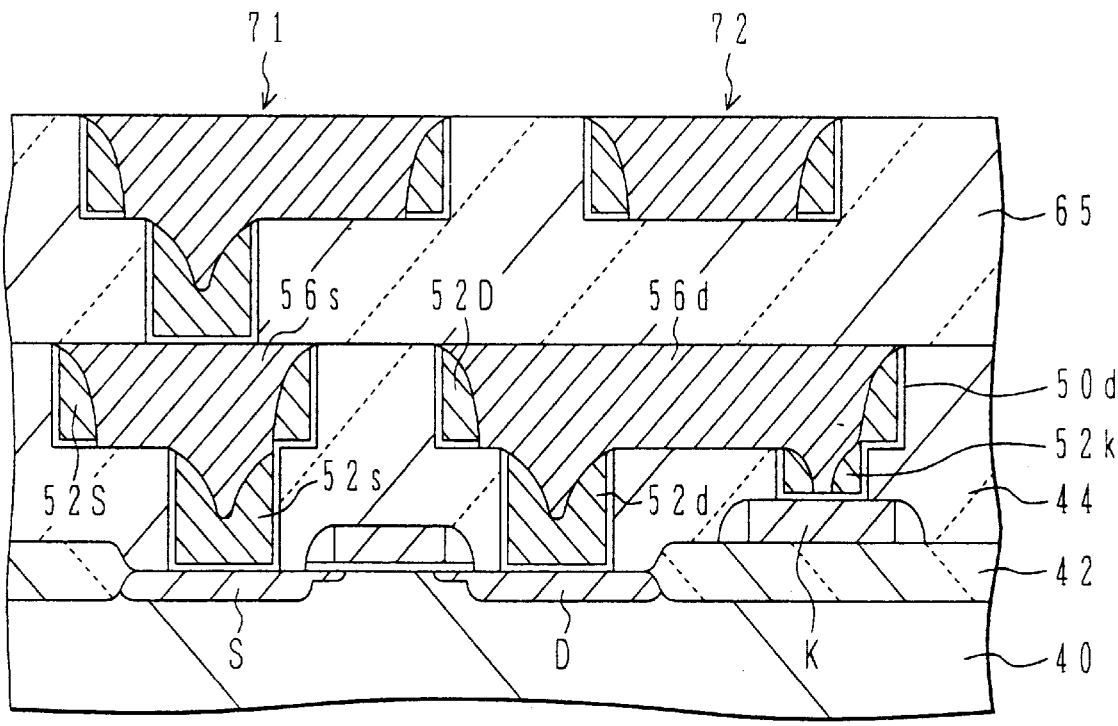

As shown in FIG. 23B, another interlayer insulating layer 65 is formed, via holes and interconnect grooves are formed, and upper level wirings 71 and 72 are formed therein by processes similar to those for the lower wirings. Similar processes may be repeated to realize a multi-layer wiring structure.

In the third embodiment described above, the void or seam Q is worked to have a normal taper over the whole side wall thereof at the process shown in FIG. 21. The void or seam Q may be worked to have a normal taper only at the upper portion thereof as illustratively shown in FIG. 24. Namely, the void or seam Q may be worked to have an upper portion and a lower portion divided at the middle level between the bottom and opening end of the void or seam Q, wherein the lower portion having a depth h to the bottom has generally a constant diameter d excepting the portion near the bottom, and the upper portion from the middle level to the opening end has a diameter gradually increasing from d toward the opening end.

Figure 24:
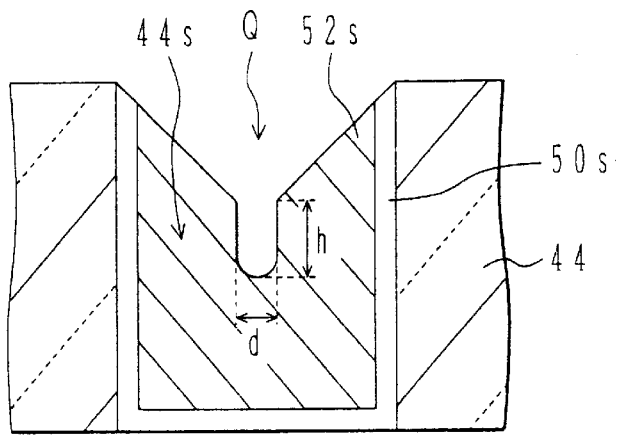
FIG. 24 is a cross sectional view of a substrate illustrating a modification of shaping a seam or void.

In the case of the plug structure shown in FIG. 24, the lower portion of the void or seam Q can be filled with a wiring material layer (at 56 in FIG. 22) such as Al alloy formed on the plug 52s, by a reflow of the wiring material layer, if h/d is 1.0 or smaller. If the wiring material layer (at 25 in FIG. 22) is formed by MOCVD (metalorganic CVD), the lower portion of the void or seam Q can be filled with the wiring material layer even if hid is about 2.0.

Figure 25:
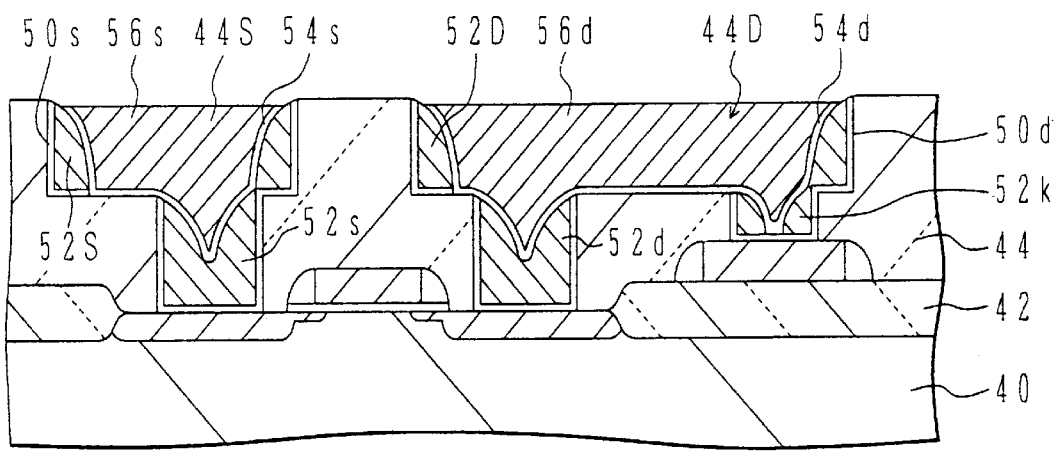
Figure 26:
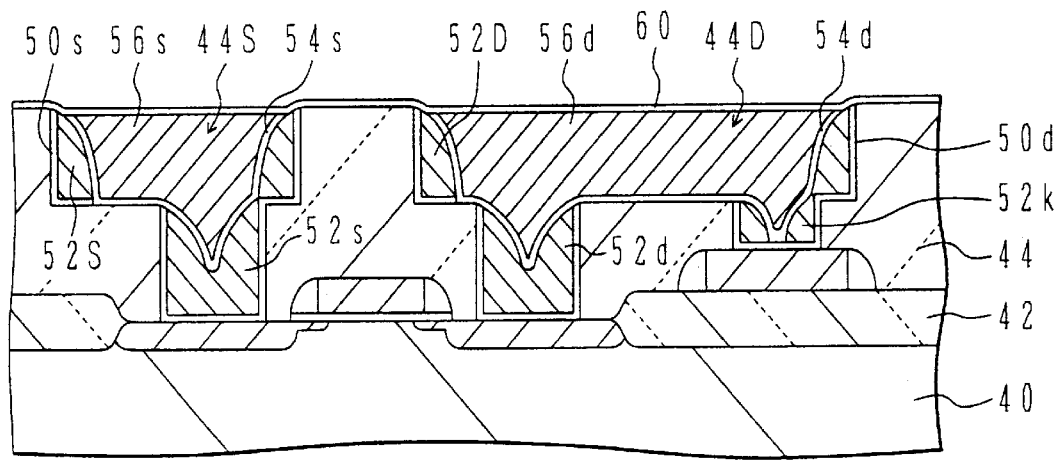

FIGS. 25 to 27 illustrate a flat wiring layer forming method according to the fourth embodiment of the invention. The features of this embodiment reside firstly in that a portion of a conductive barrier layer is left as a portion of a wiring material layer and secondary in that a portion of the cap layer 60 is left as a portion of the wiring material layer.

In the process shown in FIG. 25 following the etch-back process shown in FIG. 21, a conductive barrier layer 54 and a wiring material layer 56 are sequentially deposited similar to the case described with FIG. 13, covering the interconnect grooves 44S and 44D and exposed insulating film 44. Thereafter, similar to the case described with FIG. 14, a lamination of the barrier layer 54 and wiring material layer 56 is partially removed by CMP to a thickness sufficient for forming a recess at the upper portion of each of the interconnect grooves 44S and 44D, to leave the first portion 54s of the layer 54 and the first portion 56s of the layer 56 in the interconnect groove 44S and to leave the second portion 54d of the layer 54 and the second portion 56d of the layer 56 in the interconnect groove 44D.

In the process shown in FIG. 26, similar to the case described with FIG. 15, the cap layer 60 is formed covering the interconnect grooves 44S and 44D and exposed insulating film 44.

Figure 27A:
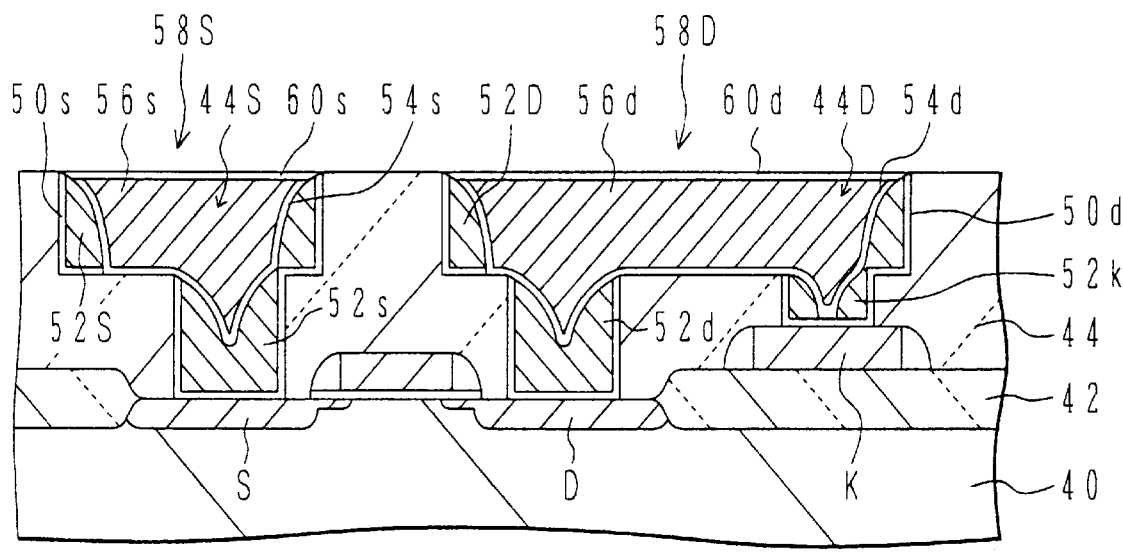

In the process shown in FIG. 27A, similar to the case described with FIG. 16, the cap layer 60 is partially removed by CMP to leave first and second portions 60s and 60d of the layer 60 in the interconnect grooves 44S and 44D.

Therefore, an interconnect layer 58S connected to the source region S and an interconnect layer 58D locally interconnecting the drain region D and wiring K are formed.

The wiring layer 58S is constituted of the left portion 50$s$ of the adhesion layer 50, plug 52$s$, side wall spacer 52S, left portion 54$s$ of the barrier layer 54, left portion 56$s$ of the wiring material layer 56, and left portion 60$s$ of the cap layer 60. The wiring layer 58D is constituted of the left portion 50$d$ of the adhesion layer 50, plugs 52$d$ and 52$k$, side wall spacer 52D, left portion 54$d$ of the barrier layer 54, left portion 56$d$ of the wiring material layer 56, and left portion 60$d$ of the cap layer 60.

Figure 27B:
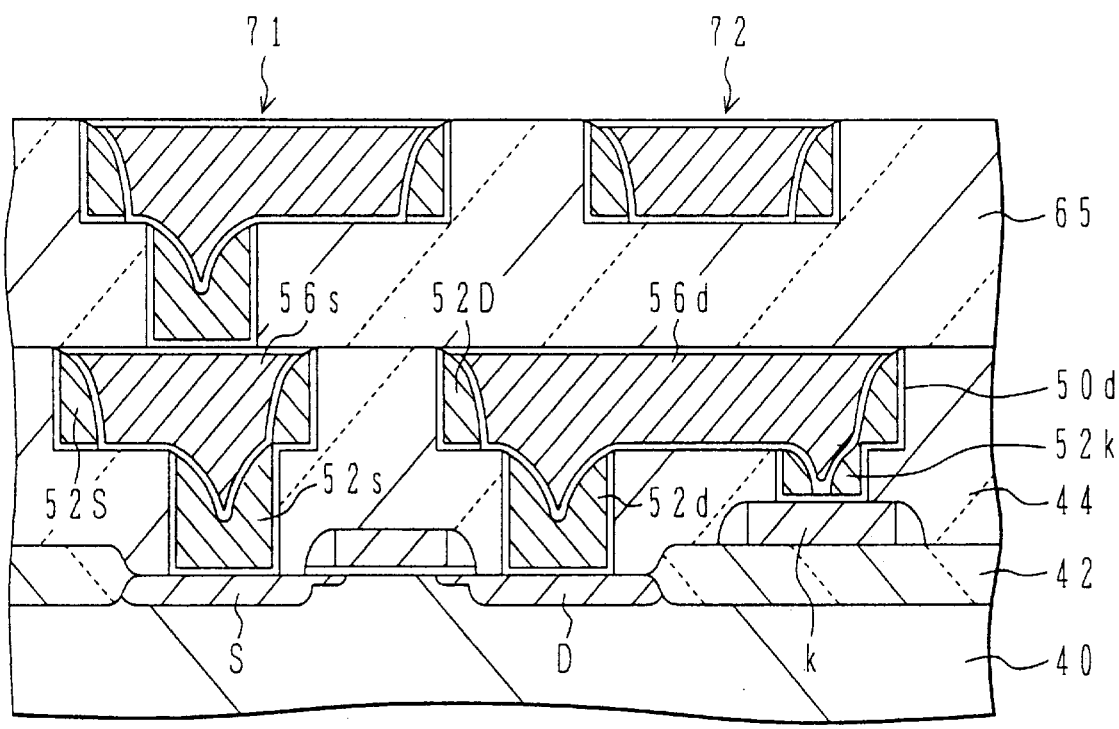
Figure 28:
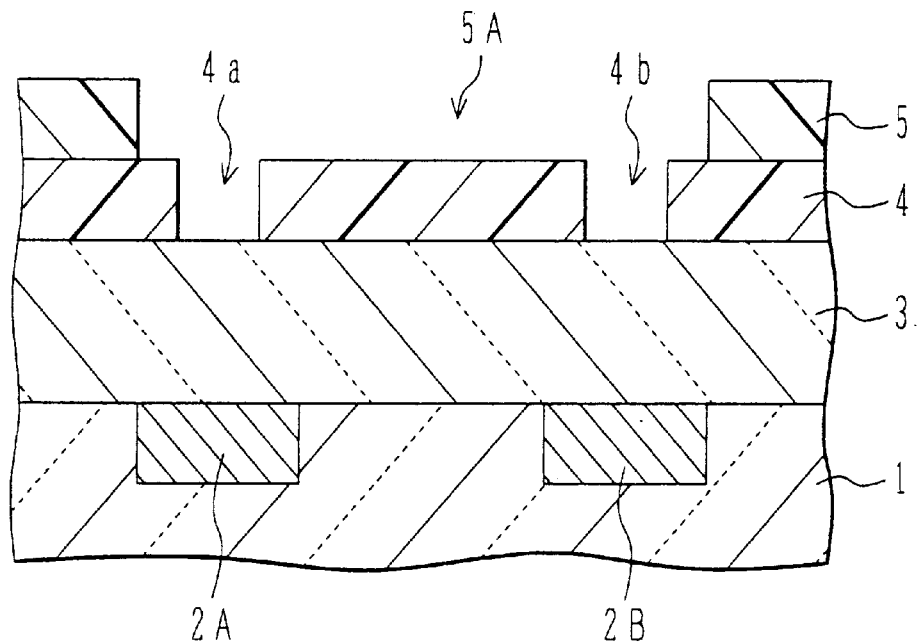
Figure 29:
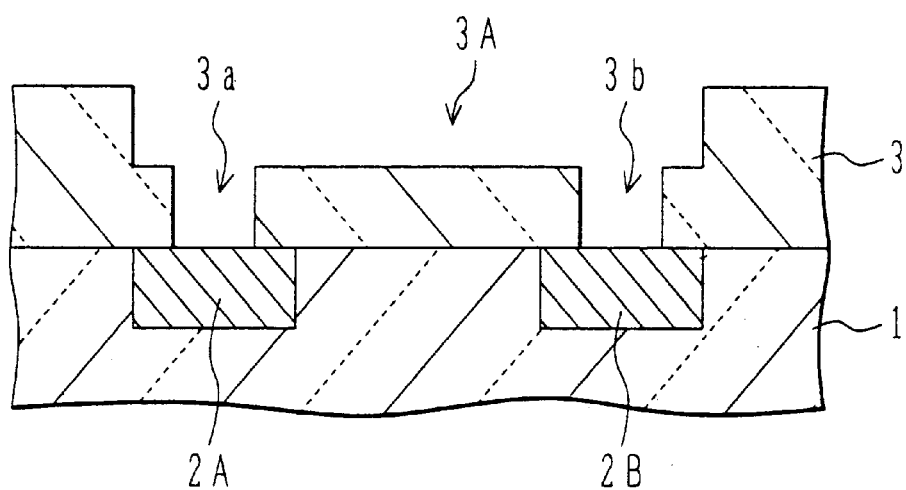
Figure 30:
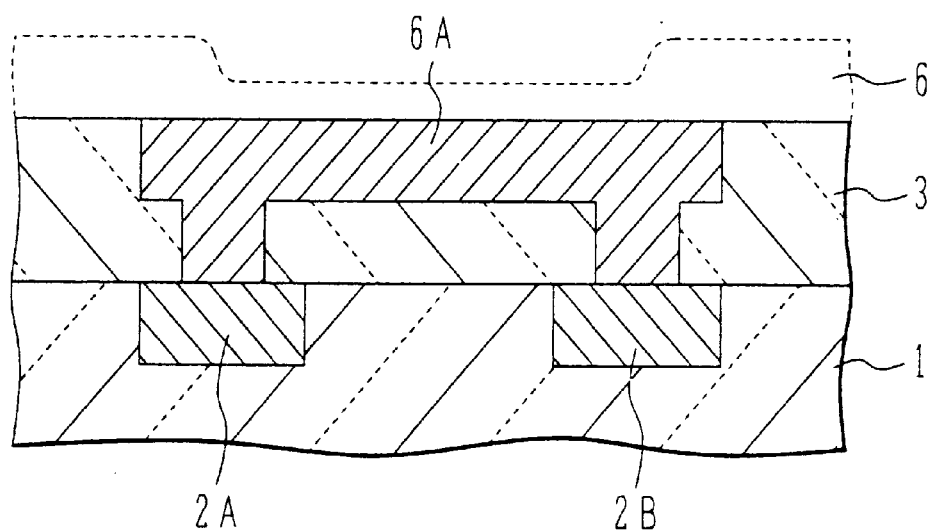

As shown in FIG. 27B, another interlayer insulating layer 65 is formed, via holes and interconnect grooves are formed in the interlayer insulating layer 65, and upper level wirings 71 and 72 having similar structures as the lower level wirings are formed. When necessary, similar processes are repeated to form multi-layer wiring structure.

In the first to fourth embodiments described above, the interconnect layers 58S and 58D connected to the source and drain regions S and D are formed. By using the processes of forming the interconnect layers 58S and 58D, higher level interconnect layers connected to the lower level interconnect layers may also be formed.

The following functions and advantages can be obtained according to the embodiments of the invention.

(a) As shown in FIGS. 11, 16, 23, and 27, since the interconnect layer 58S (58D) is constituted of the plug 52$s$ (52$d$, 52$k$) and low resistance wiring material layer 56$s$ (56$d$), it is possible to lower the resistance of the interconnect layer. The wiring resistance can be lowered further in the case of the wiring structures shown in FIGS. 23 and 27 because the void or seam Q of the plug 52$s$ (52$d$, 52$k$) is filled with the low resistance wiring layer 56$s$ (56$d$).

(b) Since the conductive material layer 52 is thinned by an etch-back, the problems associated with the CMP process can be solved, the problems including an enlarged void or seam, contamination, foreign material attachment, damages and the like to be caused by abrasive particles such as alumina.

(c) As shown in FIG. 9, the connection hole 44$s$ (44$d$, 44$k$) is filled with the plug 52$s$ (52$d$, 52$k$) and the side wall spacer 52S (52D) is formed on the side wall of the interconnect groove 44S (44D). Therefore, as shown in FIG. 10 the barrier layer 54 and wiring material layer 56 can be formed with good coverage. As a result, as shown in FIGS. 11 and 16 even if the void or seam Q is left, it is not directly exposed to the wiring material layer 56$s$ (56$d$) because of the presence of the barrier layer 54$s$ (54$d$), so that the void or seam Q is suppressed from being migrated into the wiring layer or from being diffused into the wiring layer, thereby improving the reliability of interconnects.

(d) As shown in FIG. 21, the connection hole 44$s$ (44$d$, 44$k$) is filled with the plug 52$s$ (52$d$, 52$k$), the side wall spacer 52S (52D) is formed on the side wall of the interconnect groove 44S (44D), and the void or seam Q is worked to have a normal taper. Therefore, as shown in FIG. 22 the wiring material layer 56 can be formed with good coverage. Accordingly, the void or seam Q is not left in the connection hole and the reliability of interconnects can be improved without the barrier layer as shown in FIG. 23A. If the barrier layer portion 54$s$ (54$d$) is formed as shown in FIG. 27A, the reliability of interconnects can be improved further.

(e) The side wall spacer 52S (52D) functions as the barrier layer in combination with the adhesion layer 50$s$ (50$d$). If the barrier layer 54$s$ (54$d$) is formed, the barrier performance of the barrier layers 52$s$ and 52S (52$d$ and 52D) can be reinforced. For example, if Cu or Cu alloy is used as the material of the wiring material layer 56, the side wall spacer 52S (52D) suppresses oxygen diffusion (oxidation of wiring material) from the insulating film 44 to the wiring material layer 56 and diffusion of metal such as Cu into the insulating layer 44. Such suppression effects can be enhanced by forming the barrier layer 54$s$ (54$d$). The side wall spacer can therefore improve the reliability of interconnects which is further improved by adding the barrier layer 54$s$ (54$d$).

(f) As shown in FIGS. 16 and 27A, the provision of the cap layer 60$s$ further reinforces the barrier performance of the side wall spacer and barrier layer and improves the reliability of interconnects further. The cap layer 60$s$ (60$d$) can be formed easily in self-alignment with the interconnect groove 44S (44D).

The present invention has been described in connection with the preferred embodiments. The invention is not limited only to the above embodiments. It is apparent to those skilled in the art that various modifications, improvements, combinations, and the like can be made.

What is claimed is:

1. A method of fabricating a semiconductor device, comprising the steps of:
    a) providing a substrate having an insulating layer thereon;
    b) forming a connection hole including a first sub-hole and a second sub-hole mutually aligned and connected in the insulating layer, wherein the first sub-hole has a first diameter and the second sub-hole has a second diameter larger than the first diameter;
    c) forming a first conductive layer over the substrate;
    d) removing the first conductive layer to a thickness so as to form a side wall spacer film on a side wall of the second sub-hole and a plug film in the first sub-hole;
    e) forming a barrier metal layer over the substrate to cover the side wall spacer and the plug film;
    f) forming a second conductive layer over the substrate to fill space in the connection hole; and
    g) chemical mechanical polishing the second conductive layer.

2. A method according to claim 1, wherein the first sub-hole has a space (void or seam) therein.

3. A method according to claim 1, wherein the side wall spacer and the plug are made of the first conductive film.

4. A method according to claim 1, wherein the connection hole is formed by two photolithography processes.

5. A method according to claim 1, wherein the connection hole is formed by a single photolithography process using a two-step photoresist pattern.

6. A method according to claim 1, further comprising the steps of:
    h) forming a second barrier layer over the substrate; and
    i) secondarily chemical mechanical polishing the substrate.

7. A method of fabricating a semiconductor device, comprising the steps of:
    a) providing a substrate having an insulating layer thereon;
    b) forming a connection hole including a first sub-hole and a second sub-hole mutually aligned and connected in the insulating layer, wherein the first sub-hole has a first diameter and the second sub-hole has a second diameter larger than the first diameter;
    c) forming a first conductive layer over the substrate;
    d) removing the first conductive layer to a thickness so as to form a side wall spacer film on a side wall of the second sub-hole and a plug film in the first sub-hole from the first conductive layer, respectively, wherein the plug film has a seam therein;

e) forming a barrier metal layer over the substrate to cover the side wall spacer and the plug film;

f) forming a second conductive layer over the substrate to fill space in the connection hole; and g) planarizing the second conductive layer to provide a damascene structure in the connection hole.

8. A method according to claim 7, wherein the connection hole is formed by two photolithography processes.

9. A method according to claim 7, wherein the connection hole is formed by a single photolithography process using a two-step photoresist pattern.

* * * * *